(12) United States Patent
Park et al.

(10) Patent No.: US 11,605,757 B2
(45) Date of Patent: Mar. 14, 2023

(54) DISPLAY DEVICE USING SEMICONDUCTOR LIGHT EMITTING DIODE

(71) Applicant: LG ELECTRONICS INC., Seoul (KR)

(72) Inventors: Changseo Park, Seoul (KR); Kiseong Jeon, Seoul (KR); Jinhong Park, Seoul (KR); Hwankuk Yuh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 60 days.

(21) Appl. No.: 15/751,970

(22) PCT Filed: Aug. 22, 2016

(86) PCT No.: PCT/KR2016/009256
§ 371 (c)(1),
(2) Date: Feb. 12, 2018

(87) PCT Pub. No.: WO2017/034268
PCT Pub. Date: Mar. 2, 2017

(65) Prior Publication Data
US 2018/0240937 A1 Aug. 23, 2018

(30) Foreign Application Priority Data

Aug. 21, 2015 (KR) .................. 10-2015-0118163
Aug. 4, 2016 (KR) .................. 10-2016-0099575

(51) Int. Cl.
*H01L 33/08* (2010.01)
*H01L 25/075* (2006.01)
(Continued)

(52) U.S. Cl.
CPC .......... *H01L 33/08* (2013.01); *H01L 25/0753* (2013.01); *H01L 33/382* (2013.01);
(Continued)

(58) Field of Classification Search
CPC ... H01L 33/08; H01L 25/0753; H01L 33/382; H01L 33/44; H01L 33/502; H01L 33/62;
(Continued)

(56) References Cited

U.S. PATENT DOCUMENTS 8,889,216 B2 * 11/2014 Ray ..................... H01L 27/3281
427/66
2008/0035949 A1 * 2/2008 Fudeta ................ H01L 33/0079
257/99
(Continued)

FOREIGN PATENT DOCUMENTS

JP 2003-216052 A 7/2003
JP 5126875 B2 1/2013
(Continued)

*Primary Examiner* — Benjamin Tzu-Hung Liu
(74) *Attorney, Agent, or Firm* — Birch, Stewart, Kolasch & Birch, LLP

(57) ABSTRACT

The present invention relates to a display device and, in particular, to a display device using a semiconductor light emitting diode. A display device according to the present invention comprises a substrate having a plurality of metal pads; and a plurality of semiconductor light emitting diodes electrically connected to the metal pads through self-assembly. The present invention is characterized in that: the semiconductor light emitting diodes respectively include a conductive semiconductor layer, a conductive electrode formed on one surface of the conductive semiconductor layer, and a passivation layer enclosing the semiconductor light emitting diode and provided with a through hole for exposing the conductive electrode; one end portion of the semiconductor light emitting diodes is divided into a first portion in which the conductive electrode is exposed, and a second portion in which the passivation layer is exposed; and the maximum width of the metal pad is set to a range of the width to twice the width of the second portion.

13 Claims, 27 Drawing Sheets

(51) Int. Cl.
- *H01L 33/38* (2010.01)
- *H05B 33/10* (2006.01)
- *H05B 33/14* (2006.01)
- *H05B 33/22* (2006.01)
- *H05K 1/11* (2006.01)
- *H01L 33/44* (2010.01)
- *H01L 33/50* (2010.01)
- *H01L 33/62* (2010.01)

(52) U.S. Cl.
CPC ............ *H05B 33/10* (2013.01); *H05B 33/14* (2013.01); *H05B 33/22* (2013.01); *H05K 1/111* (2013.01); *H01L 33/44* (2013.01); *H01L 33/502* (2013.01); *H01L 33/62* (2013.01); *H05K 2201/0145* (2013.01); *Y02B 20/40* (2013.01)

(58) Field of Classification Search
CPC ............ H05K 1/111; H05K 2201/0145; H05B 33/10; H05B 33/14; H05B 33/22; Y02B 20/40
See application file for complete search history.

(56) References Cited

U.S. PATENT DOCUMENTS

| | | | | |
|---|---|---|---|---|
| 2011/0210359 | A1* | 9/2011 | Park | H01L 33/0079 257/98 |
| 2012/0223345 | A1* | 9/2012 | Tomoda | H01L 33/46 257/89 |
| 2013/0015465 | A1* | 1/2013 | Lee | H01L 33/40 257/76 |
| 2014/0334137 | A1* | 11/2014 | Hasenoehrl | F21K 9/20 362/147 |
| 2015/0362165 | A1* | 12/2015 | Chu | H01L 27/156 362/235 |
| 2016/0181476 | A1* | 6/2016 | Chang | H01L 33/06 257/13 |

FOREIGN PATENT DOCUMENTS

| | | | |
|---|---|---|---|
| KR | 10-2010-0036517 | A | 4/2010 |
| KR | 10-2010-0042481 | A | 4/2010 |
| KR | 101034144 | * | 5/2011 |
| KR | 10-2011-0069377 | A | 6/2011 |
| KR | 10-2011-0116453 | A | 10/2011 |
| KR | 10-2012-0108762 | A | 10/2012 |
| KR | 10-1521939 | B1 | 5/2015 |

* cited by examiner

[SEMICONDUCTOR LIGHT EMITTING DEVICES]

[WIRING SUBSTRATES]

DISPLAY DEVICE USING SEMICONDUCTOR LIGHT EMITTING DIODE

CROSS REFERENCE TO RELATED APPLICATIONS

This application is the National Phase of PCT/KR2016/009256 filed on Aug. 22, 2016, which claims priority under 35 U.S.C. § 119(a) to Patent Application Nos. 10-2015-0118163 and 10-2016-0099575 filed respectively in Republic of Korea on Aug. 21, 2015 and Aug. 4, 2016, all of which are hereby expressly incorporated by reference into the present application.

BACKGROUND OF THE INVENTION

1. Field of the Invention

The present disclosure relates to a display device and a fabrication method thereof, and more particularly, to a flexible display device using a semiconductor light emitting device.

2. Description of the Related Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices, particularly, micro LEDs, may be used to implement a flexible display, thereby presenting a scheme for solving the problems.

However, in a large area display device using such micro LEDs, a micro LED must be arranged in a lower wiring located in each pixel region, but there exists a problem in which the arrangement is difficult due to a small size thereof.

According to the related art, self alignment using a capillary force has been used when aligning the micro LED to the lower wiring, but a probability of the self-aligned micro LED is lowered due to too weak power of the capillary force, thereby causing a problem of reducing the yield.

Furthermore, according to the related art, a single micro LED must be aligned in a single pixel region, but there is a problem that a plurality of micro LEDs are arranged in one pixel region. In this case, defects may occur at the time of assembling the micro LEDs, and accordingly, the present disclosure proposes a mechanism capable of reducing such defects.

SUMMARY OF THE INVENTION

An object of the present disclosure is to provide a structure for improving assembly reliability in the self-assembly of a semiconductor light emitting device in a display device.

Another object of the present disclosure is to provide a display device in which a semiconductor light emitting device can be assembled one-on-one in a self-assembly region.

Still another object of the present disclosure is to provide a display device in which a plurality of semiconductor light emitting devices are precisely and efficiently aligned on a substrate.

A display device according to the present disclosure includes a substrate having a plurality of metal pads and a plurality of semiconductor light emitting devices electrically connected to the metal pads through self-assembly. The semiconductor light emitting devices may respectively include a conductive semiconductor layer, a conductive electrode formed on a surface of the conductive semiconductor layer, and a passivation layer provided with a through hole to surround the semiconductor light emitting device and expose the conductive electrode. One end portion of the semiconductor light emitting devices may be partitioned into a first portion in which the conductive electrode is exposed and a second portion in which the passivation layer is exposed, and a maximum width of the metal pad may be set to a range of a width of the second portion to twice the width.

A display device according to another embodiment of the present disclosure may include a lower substrate at an upper portion of which at least two lower wirings are disposed, and at least two light emitting devices having a first electrode electrically connected to the lower wirings and a light emitting structure configured to generate light, wherein the light emitting structure includes a center region in which the first electrode is disposed and a peripheral region formed to surround the center region, and the center region has a step to the peripheral region.

In a display device according to the present disclosure, a minimum distance (X) of a region where the conductive electrode of the semiconductor light emitting device is absent≤a maximum distance (Y) of the metal pad of the substrate≤2X, and thus only one semiconductor light emitting device may be assembled in a single self-assembly region. Through this, assembly reliability may be improved in the self-assembly process to secure production yield.

Furthermore, through this, when a plurality of semiconductor light emitting devices are coupled to one metal pad, a mechanism may be realized in which no electrical connection is made between the conductive electrode and the conductive pad.

In addition, according to an embodiment, there may exist an advantage of reducing a probability that two or more light emitting devices are arranged in a single pixel region due to a mating of the light emitting structure and the substrate.

Moreover, according to an embodiment, there may exist an advantage of reducing a defective electrical connection between the light emitting device and the lower wiring even if the light emitting structure is rotated on an axis perpendicular to the lower substrate in a shape of the light emitting structure.

Besides, according to an embodiment, a magnetic portion and a reaction portion are used for the lower substrate and the light emitting device, and there exists an advantage of improving a probability of correct alignment of the light emitting device using a capillary force and a magnetic force.

Furthermore, according to an embodiment, an inorganic light emitting device may be disposed in a pixel region, thereby having an advantage capable of implementing a high-speed screen with a fast response speed.

In addition, according to an embodiment, a separate backlight unit is not required, thereby having an advantage of excellent brightness and excellent efficiency.

Moreover, the light emitting device may be an inorganic material, thereby having an advantage of a long lifespan.

In addition, according to an embodiment, the light emitting devices may be arranged in the unit of pixels, thereby having an advantage in that it can be easily implemented in an active manner.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
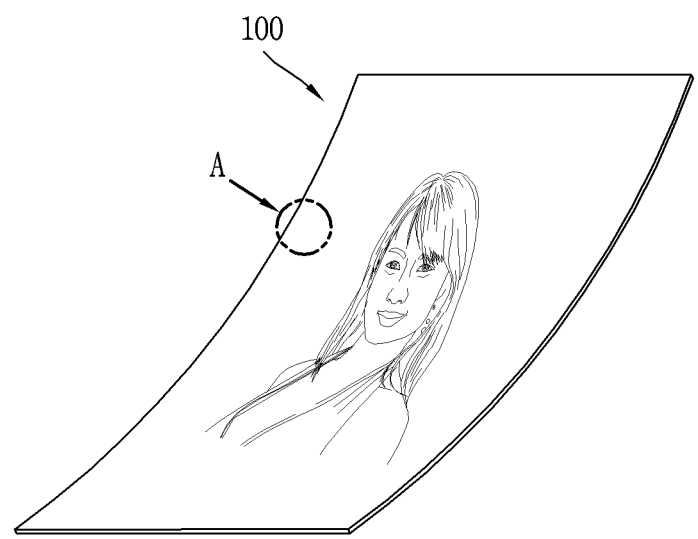
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the present disclosure, if a detailed explanation for a related known function or construction is considered to unnecessarily divert the gist of the present disclosure, such explanation has been omitted but would be understood by those skilled in the art. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (FDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view illustrating a display device using a semiconductor light emitting device according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
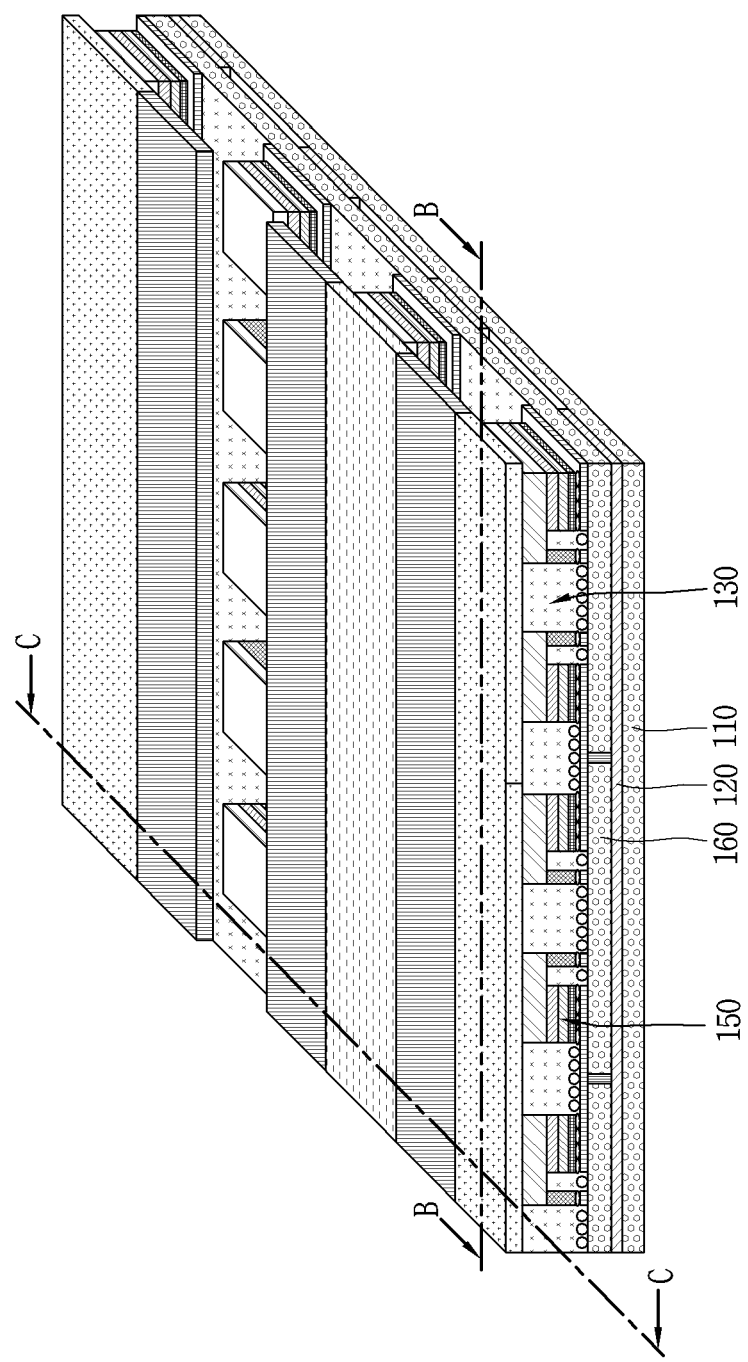
FIG. 2 is a partial enlarged view of portion "A" in FIG. 1, and FIGS. 3A and 3B are cross-sectional views taken along lines B-B and C-C in FIG. 2.
Figure 3A:
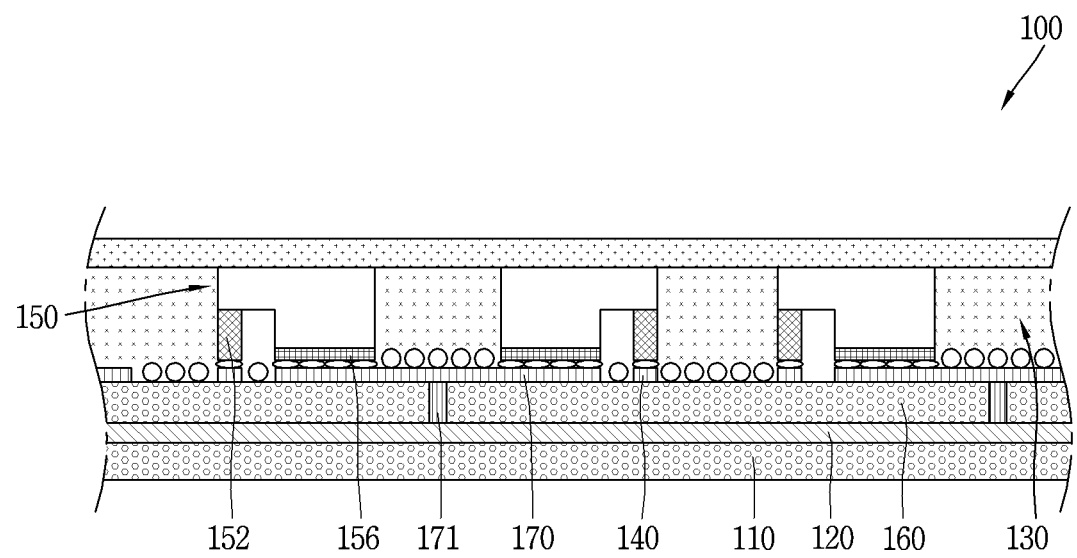
Figure 3B:
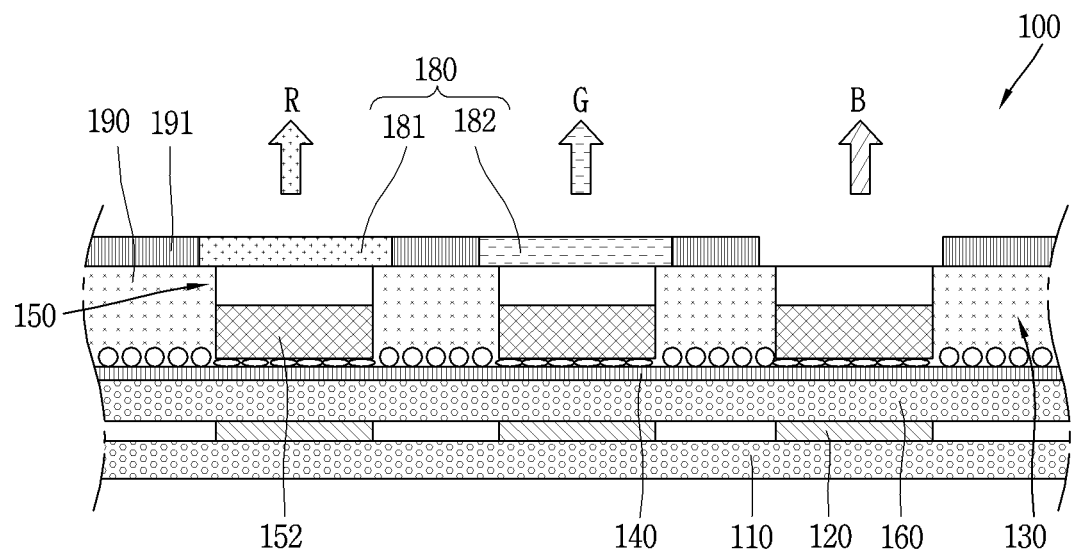
Figure 4:
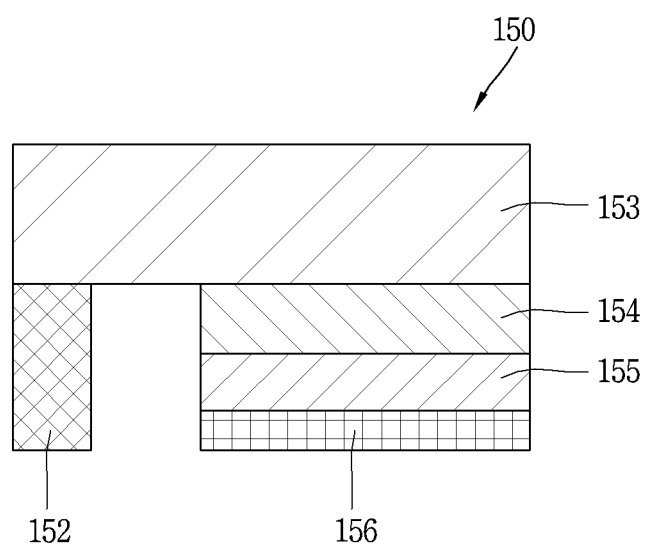
FIG. 4 is a conceptual view illustrating a flip chip type semiconductor light emitting device in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

According to the drawings in FIGS. 2, 3A and 3B, there is illustrated a display device 100 using a passive matrix (PM) type semiconductor light emitting device as a display device 100 using a semiconductor light emitting device. However, an example described below may also be applicable to an active matrix (AM) type semiconductor light emitting device.

The display device 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device may be a flip chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. As described above, the conductive adhesive layer 130 may form an electrical connection as well as allow a mutual coupling between the semiconductor light emitting device 150 and the auxiliary electrode 170 and between the semiconductor light emitting device 150 and the second electrode 140.

Furthermore, a plurality of semiconductor light emitting devices 150 constitute a light-emitting array, and a phosphor layer 180 is formed on the light-emitting array.

The light emitting device array may include a plurality of semiconductor light emitting devices with different self-luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip chip form, and thus semiconductor light emitting devices grown on a transparent dielectric substrate. Furthermore, the semiconductor light emitting devices may be nitride semiconductor light emitting devices, for instance. The semiconductor light emitting device 150 has an excellent luminance characteristic, and thus it may be possible to configure individual sub-pixels even with a small size thereof.

According to the drawing, a partition wall 190 may be formed between the semiconductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a location implementing a red sub-pixel, and a green phosphor 182 capable of converting blue light into green (G) light may be deposited on the blue semiconductor light emitting device 151 at a location implementing a green sub-pixel. Furthermore, only the blue semiconductor light emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
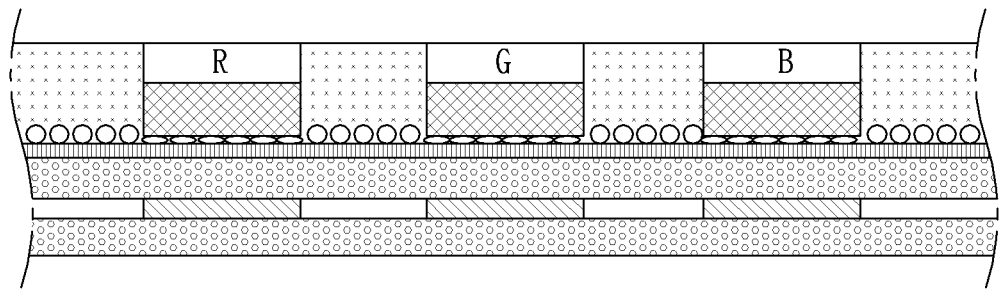
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this case, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
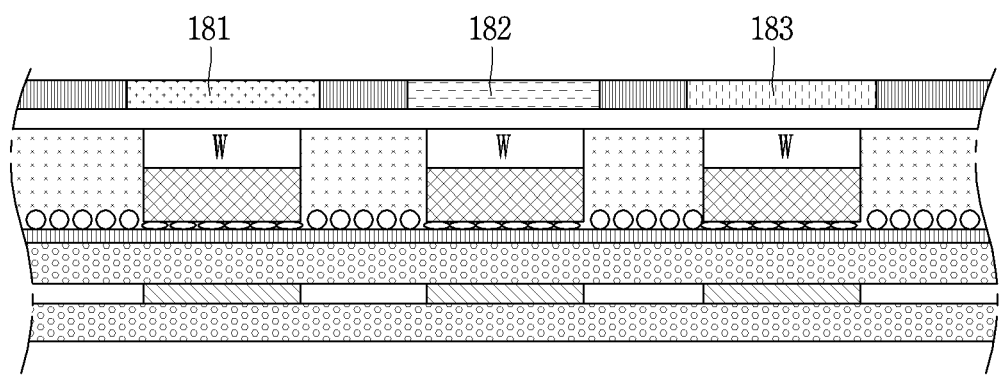

Referring to FIG. 5B, the semiconductor light emitting device may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
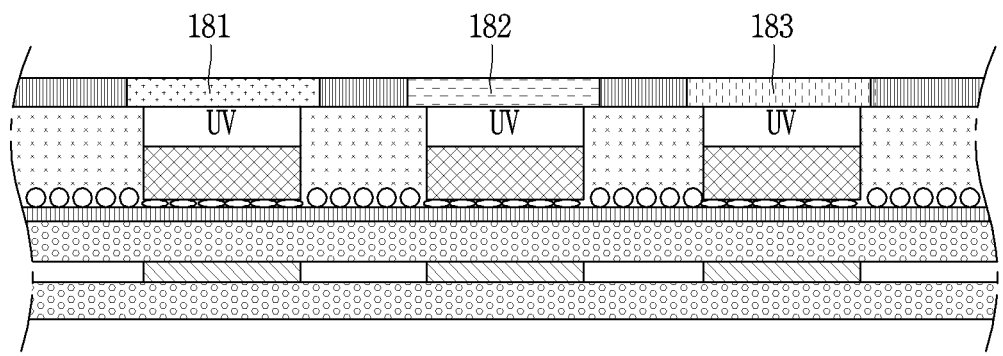

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 may have excellent luminance characteristics, and thus it may be possible to configure individual sub-pixels even with a small size thereof. The size of the individual semiconductor light emitting device 150 may be less than 80 μm in the length of one side thereof, and formed with a rectangular or square shaped element. In case of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light emitting devices becomes sufficiently large. Accordingly, in this case, it may be possible to implement a flexible display device having a HD image quality.

A display device using the foregoing semiconductor light emitting device will be fabricated by a new type of fabrication method. Hereinafter, the fabrication method will be described with reference to FIG. 6.

Figure 6:
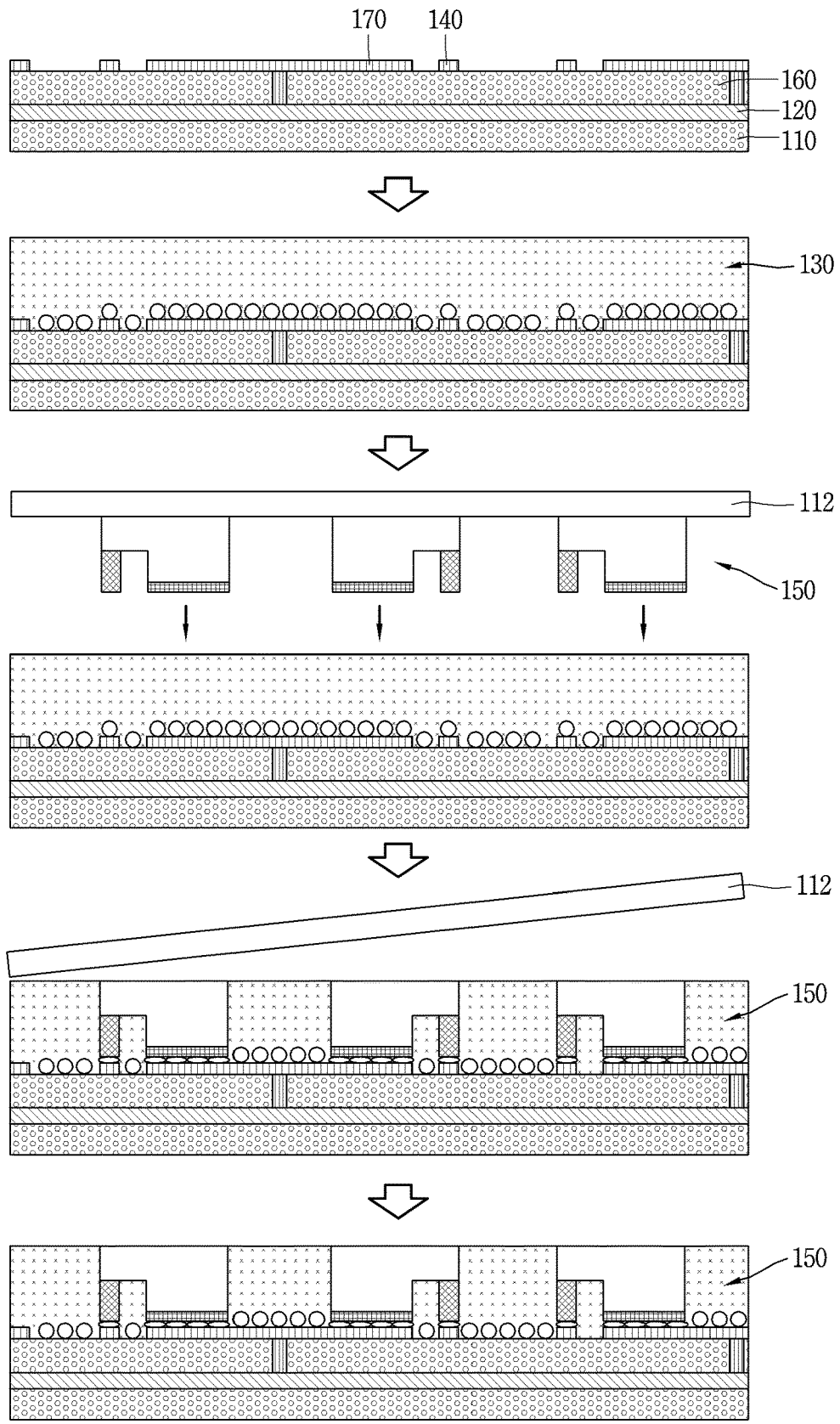
FIG. 6 is cross-sectional views illustrating a fabrication method of a display device using a semiconductor light emitting device according to the present disclosure.

FIG. 6 is cross-sectional views illustrating a fabrication method of a display device using a semiconductor light emitting device according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this case, the second substrate 112 as a growth substrate for growing the semiconductor light emitting device 150 may be a sapphire substrate or silicon substrate.

The semiconductor light emitting device may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer (not shown).

Furthermore, it may further include the process of forming a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For such an example, the foregoing display device may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
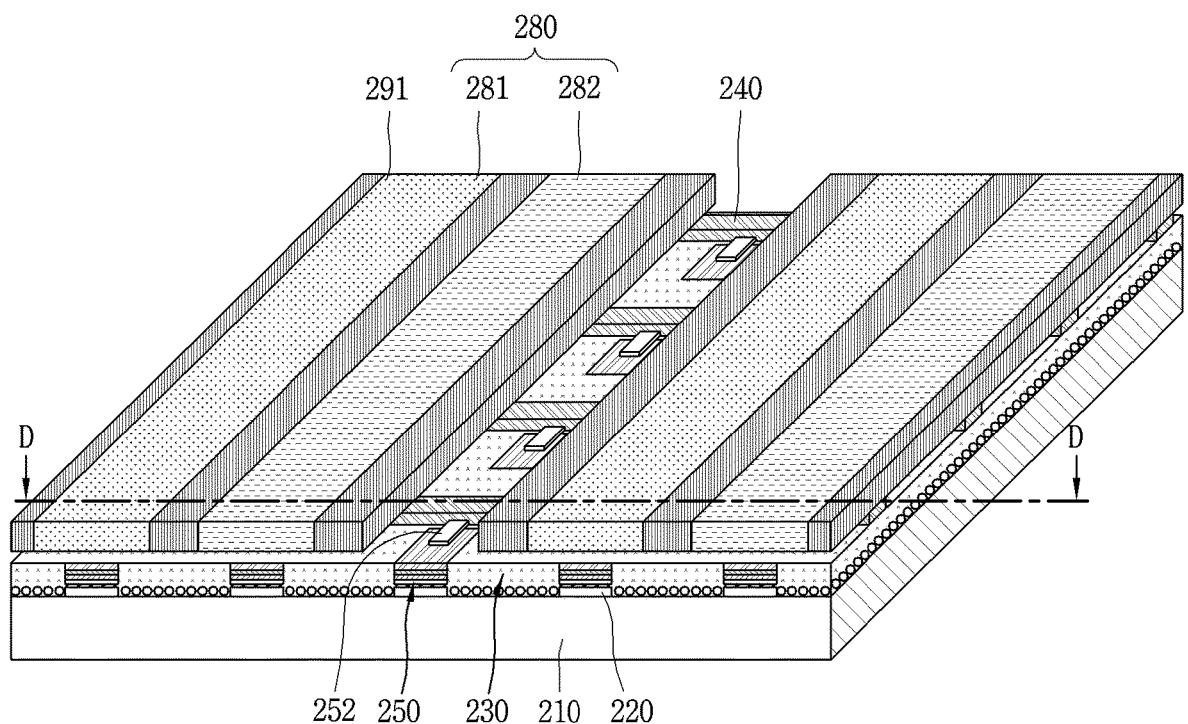
FIG. 7 is a perspective view illustrating a display device using a semiconductor light emitting device according to another embodiment of the present disclosure.
Figure 8:
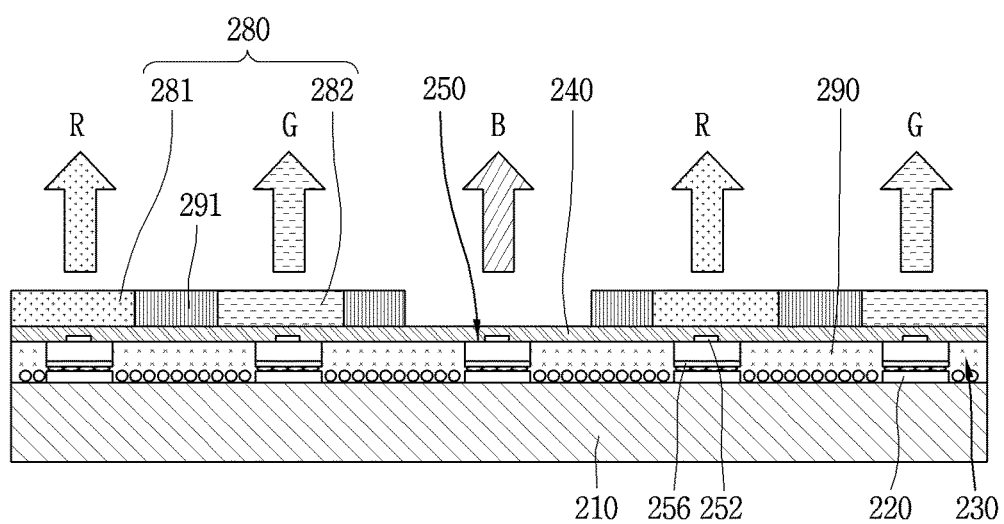
FIG. 8 is a cross-sectional view taken along line D-D in FIG. 7.
Figure 9:
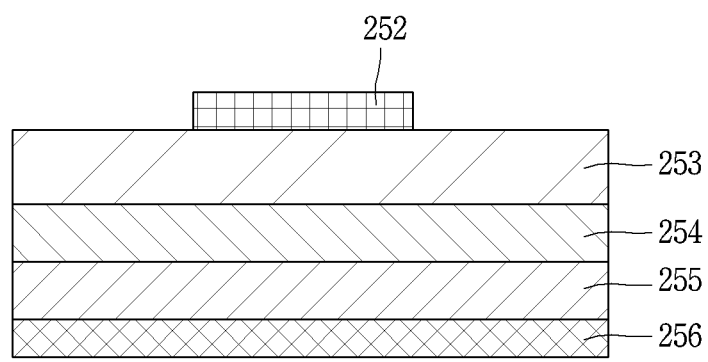
FIG. 9 is a conceptual view illustrating a vertical type semiconductor light emitting device in FIG. 8.

FIG. 7 is a perspective view illustrating a display device using a semiconductor light emitting device according to another embodiment of the present disclosure. FIG. 8 is a cross-sectional view taken along line C-C in FIG. 7, and FIG. 9 is a conceptual view illustrating a vertical type semiconductor light emitting device in FIG. 8.

According to the drawings, the display device may be display device using a passive matrix (PM) type of vertical semiconductor light emitting device.

The display device may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

In this manner, the semiconductor light emitting device 250 is placed on the conductive adhesive layer 230, thereby configuring a separate sub-pixel in the display device. The semiconductor light emitting device 250 may have excellent luminance characteristics, and thus it may be possible to configure individual sub-pixels even with a small size thereof. The size of the individual semiconductor light emitting device 250 may be less than 80 µm in the length of one side thereof, and formed with a rectangular or square shaped element. In case of a rectangular shaped element, the size thereof may be less than 20×80 µm.

The semiconductor light emitting device 250 may be a vertical structure.

A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring to FIG. 8 again, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light emitting devices 250, the partition wall 290 may be located between the semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light emitting device 250 is located on the conductive adhesive layer 230, thereby constituting individual pixels on the display device. The semiconductor light emitting device 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light emitting device.

In a display device using the semiconductor light emitting device of the present disclosure described above, a semiconductor light emitting device grown on a wafer and formed through mesa and isolation is used as an individual pixel. Since a method of transferring a semiconductor light emitting device grown on a wafer to a wiring substrate is used, there is a problem that it is difficult to realize a large screen display due to a size limitation of the wafer. In order to solve such a problem, a method of assembling a semiconductor light emitting device into a wiring substrate in a self-assembly manner may be applied.

The self-assembly method is a method of placing semiconductor light emitting devices on a wiring substrate or an assembly substrate in a chamber filled with a fluid. For example, the semiconductor light emitting devices and the substrate are placed in a chamber filled with a fluid, and the fluid is heated in such a manner that the semiconductor light emitting devices are assembled to the substrate by themselves. For this purpose, the substrate may be provided with grooves into which the semiconductor light emitting devices are inserted. Specifically, grooves on which the semiconductor light emitting devices are placed at positions where the semiconductor light emitting devices are aligned with the wiring electrodes are formed on the substrate. The grooves are formed in a shape corresponding to a shape of the semiconductor light emitting devices, and the semiconductor light emitting devices are assembled into the grooves while randomly moving in the fluid.

Meanwhile, in the self-assembly method, defects may occur during the assembly of the semiconductor light emitting device, and the present disclosure provides a semiconductor light emitting device and a wiring substrate having a new structure capable of reducing such defects. Hereinafter, it will be described in more detail with reference to the drawings.

Figure 10:
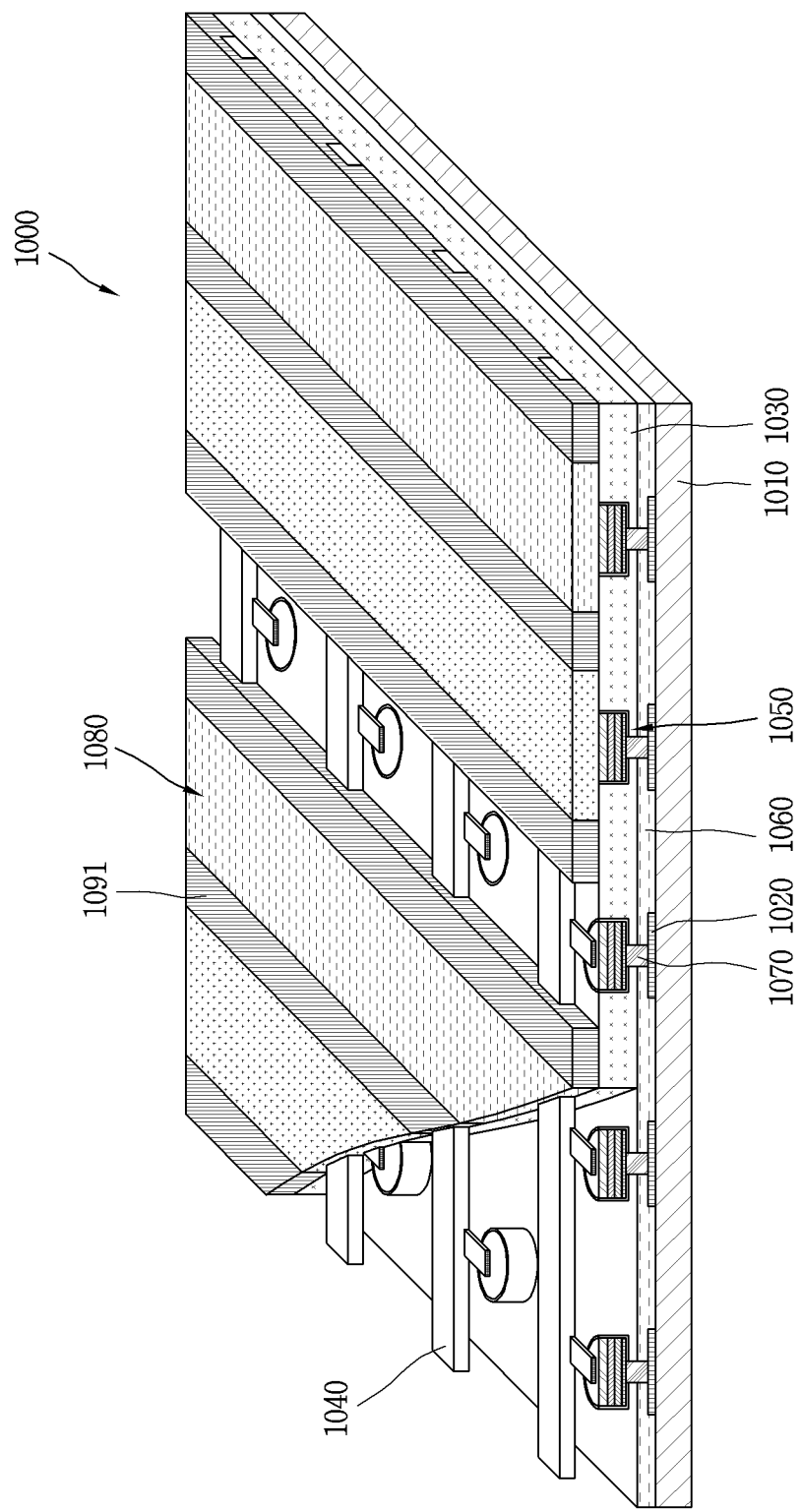
FIG. 10 is an enlarged view of portion "A" in FIG. 1 for explaining another embodiment of the present disclosure to which a semiconductor light emitting device and a wiring substrate having a new structure are applied.
Figure 11:
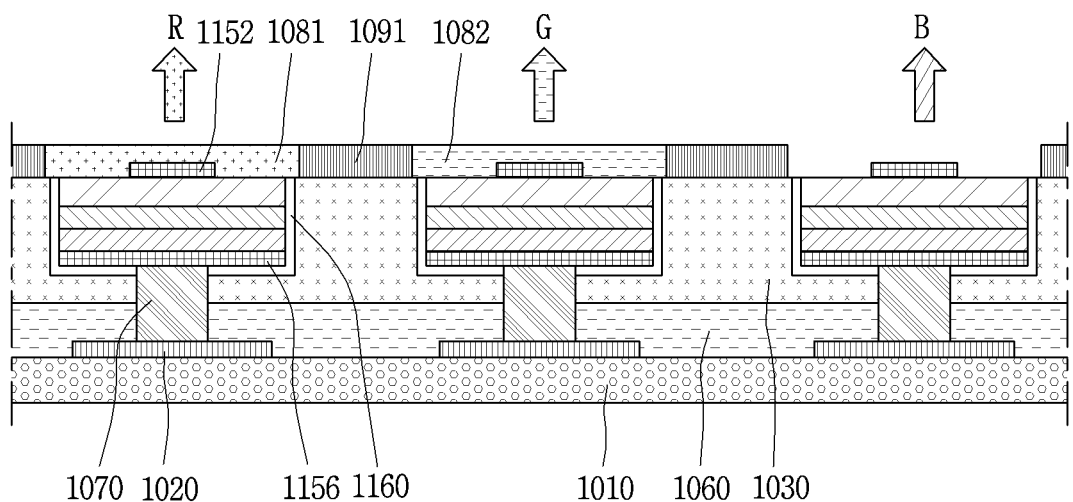
FIG. 11 is a cross-sectional view taken along line E-E in FIG. 10.
Figure 12A:
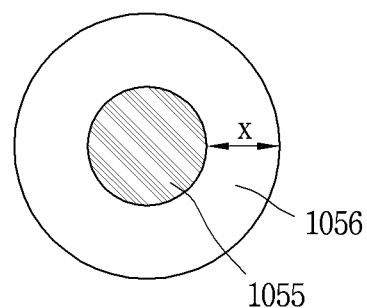
FIGS. 12A and 12B are plan views of the semiconductor light emitting device and the wiring substrate of FIG. 10.
Figure 12B:
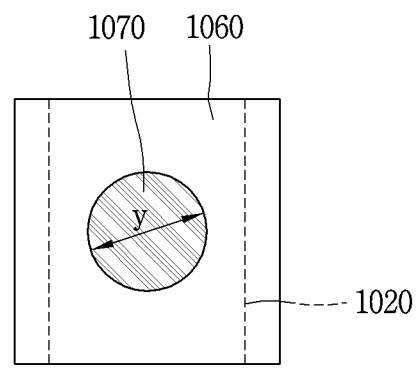
Figure 13:
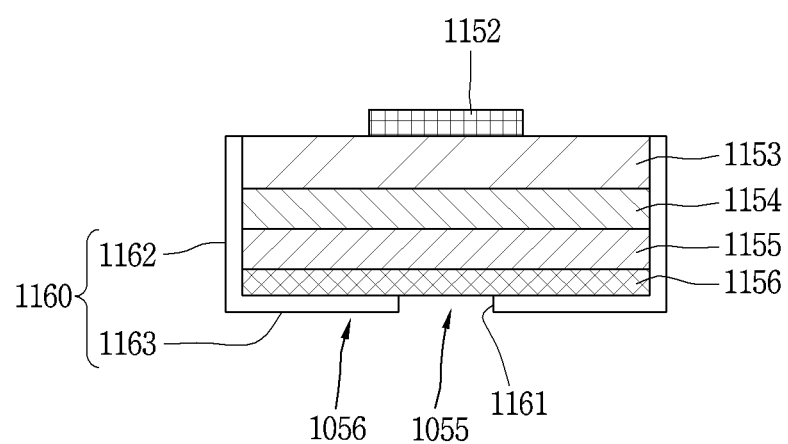
FIG. 13 is an enlarged view illustrating a semiconductor light emitting device having a new structure of FIG. 10.

FIG. 10 is an enlarged view of portion "A" in FIG. 1 for explaining another embodiment of the present disclosure to which a semiconductor light emitting device and a wiring substrate having a new structure are applied, FIG. 11 is a cross-sectional view taken along line E-E in FIG. 10, FIGS. 12A and 12B are plan views of the semiconductor light emitting device and the wiring substrate of FIG. 10, and FIG. 13 is an enlarged view illustrating a semiconductor light emitting device having a new structure of FIG. 10.

According to the illustrations of FIGS. 10, 11, 12A, 12B and 13, a display device 1000 using a semiconductor light emitting device is illustrated as a display device 1000 using a passive matrix (PM) type vertical semiconductor light emitting device. However, an example described below may also be applicable to an active matrix (AM) type semiconductor light emitting device.

The display device 1000 includes a substrate 1010, a first electrode 1020, a second electrode 1040, a plurality of semiconductor light emitting devices 1050, an insulating layer 1060, and metal pads 1070. Here, the first electrode 1020 and the second electrode 1040 may respectively include a plurality of electrode lines.

The substrate 1010 as a wiring substrate disposed with the first electrode 1020 may include polyimide (PI) to implement a flexible display device. In addition, any one may be used if it is an insulating and flexible material.

The first electrode 1020 may be located on the substrate 1010, and formed with a bar-shaped electrode elongated in one direction. The first electrode 1020 may be formed to perform the role of a data electrode.

According to the drawing, an insulating layer 1060 may be disposed on the substrate 1010 placed with the first electrode 1020, and the metal pads 1070 may be placed on the insulating layer 1060. More specifically, the first electrode 1020 may be disposed on one surface of the substrate 1010, and the insulating layer 1060 covering the first electrode 1020 may be formed on the first surface 1020. In this case, a configuration in which the insulating layer 1060 is deposited on the substrate 1010 may be a single wiring substrate. In addition, the first electrode 1020 may be a lower wiring made of a conductive material.

More specifically, the insulating layer 1060 may be incorporated into the substrate 1010 with an insulating and flexible material such as polyimide (PI), PET, PEN or the like while covering the lower wiring to form a single wiring substrate.

The metal pads 1070 as an auxiliary electrode for electrically connecting the first electrode 1020 to the semiconductor light emitting device 1050 are placed on the insulating layer 1060, and disposed to correspond to the location of the first electrode 1020. For example, the metal pads 1070 have a dot shape, and may be electrically connected to the first electrode 1020 by means of an electrode hole 1071 passing through the insulating layer 1060. In other words, the metal pads 1070 may be connected to the lower wiring, and disposed to be exposed to an outside through the insulating layer 1060.

According to the drawings, the semiconductor light emitting device 1050 is formed in a shape of being fitted to the metal pads 1070.

Referring to FIG. 13, the semiconductor light emitting device 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

The first conductive semiconductor layer 1155 and the second conductive semiconductor layer 1153 overlap with each other, and the second conductive electrode 1152 is disposed on an upper surface of the second conductive semiconductor layer 1153, and the first conductive electrode 1156 is disposed on a lower surface of the first conductive semiconductor layer 1155. In this case, the upper surface of the second conductive semiconductor layer 1153 may be one surface of the second conductive semiconductor layer 1153 farthest from the first conductive semiconductor layer 1155, and the lower surface of the first conductive semiconductor layer 1155 may be one surface of the first conductive semiconductor layer 1155 farthest from the second conductive semiconductor layer 1153. In this manner, the first conductive electrode 1156 and the second conductive electrode 1152 are respective disposed on the upper and lower sides of the first conductive semiconductor layer 1155 and the second conductive semiconductor layer 1153 by interposing them therebetween.

Referring to FIG. 13 together with FIGS. 10, 11, 12A and 12B, the lower surface of the first conductive semiconductor layer 1155 may be a surface closest to the wiring substrate, and the upper surface of the second conductive semiconductor layer may be a surface farthest from the wiring substrate.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

In this case, the p-type electrode located at the top thereof may be electrically connected to the first electrode 1020 by the conductive adhesive layer 1030, and the n-type electrode 252 located at the bottom thereof may be electrically connected to the second electrode 1040. Here, the p-type electrode may include a plurality of metal layers formed of different metals. For example, a plurality of metal layers made of Ti, Pt, Au, Ti, Cr or the like may be laminated to form the p-type electrode.

For another example, the n-type electrode and the second electrode 1040 may be integrally formed. In other words, when the second conductive electrode 1152 is deposited on one surface of the second conductive semiconductor layer 1153, the second conductive electrode 1152 may be formed in the same line shape as the second electrode to electrically connect neighboring semiconductor light emitting devices.

Here, the semiconductor light emitting device includes a passivation layer 1160 formed to surround the lateral surfaces of the first conductive semiconductor layer 1155 and the second conductive semiconductor layer 1153.

The passivation layer 1160 covers the lateral surface of the semiconductor light emitting device to stabilize the characteristics of the semiconductor light emitting device and is formed of an insulating material. As described above, the first conductive semiconductor layer 1155 and the second conductive semiconductor layer 1153 are electrically disconnected by the passivation layer 1160, and thus the p-type GaN and n-type GaN of the semiconductor light emitting device may be insulated from each other.

On the other hand, referring to FIGS. 10 through 12B, a plurality of second electrodes 1040 disposed in a direction of crossing the length direction of the first electrode 1020, and electrically connected to the semiconductor light emitting device 1050 may be located between the semiconductor light emitting devices.

According to the drawings, the second electrode 1040 may be located on a planarizing layer 1030. The planarizing layer 1030 is disposed between the insulating layer 1060 and the second electrode 1040 of the wiring substrate. More specifically, an insulating material is filled between the semiconductor light emitting devices to form a planarizing layer, and the second electrode 1040, which is an upper wiring, is disposed on one surface of a planarizing layer 1030. In this case, the second electrode 1040 may be electrically connected by contact with the second conductive electrode 1040 of the semiconductor light emitting device 1050.

A plurality of semiconductor light emitting devices 1050 are coupled to the wiring substrate 1010, and electrically connected to the first electrode 1020 and the second electrode 1040 by the foregoing structure.

As shown in the drawing, the plurality of semiconductor light emitting devices 1050 may form a plurality of columns in a direction parallel to a plurality of electrode lines provided in the first electrode 1020. However, the present disclosure is not necessarily limited thereto. For example, the plurality of semiconductor light emitting devices 1050 may form a plurality of columns along the second electrode 1040.

Moreover, the display device 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light may be deposited on the blue semiconductor light emitting device 1051a at a location implementing a red sub-pixel, and a green phosphor 1082 capable of converting blue light into green (G) light may be deposited on the blue semiconductor light emitting device 1051b at a location implementing a green sub-pixel. Furthermore, only the blue semiconductor light emitting device 1051c may be solely used at a location implementing a blue sub-pixel. In this case, the red (R), green (G) and blue (B) sub-pixels may implement one pixel. More specifically, one color phosphor may be deposited along each line of the first electrode 1020. Accordingly, one line on the first electrode 1020 may be an electrode controlling one color. In other words, red (R), green (B) and blue (B) may be sequentially disposed along the second electrode 1040, thereby implementing sub-pixels. However, the present disclosure may not be necessarily limited to this, and the semiconductor light emitting device 1050 may be combined with a quantum dot (QD) instead of a phosphor to implement sub-pixels that emit red (R), green (G) and blue (B).

On the other hand, in order to improve the contrast of the phosphor layer 1080, the display device may further include a black matrix 1091 disposed between each phosphor. The black matrix 1091 may be formed in such a manner that a gap is formed between the phosphor dots and a black material fills the gap. Through this, the black matrix 1091 may improve contrast between light and dark while absorbing external light reflection. The black matrix 1091 is located between respective phosphor layers along the first electrode 1020 in a direction in which the phosphor layers 1080 are layered. In this case, a phosphor layer may not be formed at a position corresponding to the blue semiconductor light emitting device 1051, but the black matrix 1091 may be respectively formed at both sides thereof by interposing a space that does not have the blue light emitting device 1051c therebetween.

According to the foregoing structure, a display device including semiconductor light emitting devices may be realized by self-assembly.

In this case, the passivation layer 1160 includes a through hole 1161 to expose the first conductive electrode 1156. The metal pad 1070 is inserted into the through hole 1161, so that the semiconductor light emitting device can be coupled to the wiring substrate. Here, the metal pad 1070 may include an alloy made of at least two or more combinations of Bi, In, Pb, Sn, and Ag. Here, when the semiconductor light emitting device is self-assembled, the wiring substrate is immersed in a fluid in a state where the metal pad 1070 is melted, and the metal pad 1070 and the conductive electrodes are coupled to each other while the metal pad 1070 is solidified.

The semiconductor light emitting device and the metal pad of the present example are provided with a mechanism capable of ensuring assembly reliability during self-assembly.

For example, one end portion of the semiconductor light emitting devices may be partitioned into a first portion 1055 in which the conductive electrode is exposed and a second portion 1056 in which the passivation layer 1160 is exposed. In the present example, the one end portion as a portion corresponding to a lower surface of the semiconductor light emitting devices may be a surface closest to the wiring substrate and a peripheral portion thereof.

According to the drawing, the first conductive electrode 1156 is exposed by the through hole 1161 of the passivation layer 1160, and thus the first portion 1055 may be a portion corresponding to the through hole 1161. The second portion 1056, as a region from an outer circumference of the through hole 1161 to an outer circumference of the passivation layer 1160 on a lower surface of the semiconductor light emitting devices, may be a region in which the first conductive electrode 1156 is not exposed.

In this case, a maximum width (Y) of the metal pad 1070 may be set to a range of a width (X) of the second portion to twice the width to restrict a plurality of conductive electrodes from being brought into contact with one of the metal pads 1070. More specifically, here, a width of the second portion 1056 may be a minimum distance of a region where the conductive electrode of the semiconductor light emitting device is absent. Therefore, X and Y are set to a range of $X \leq Y \leq 2X$, and through this, only one semiconductor light emitting device may be assembled in a single self-assembly region.

In this case, the minimum distance (X) of a region where the metal pad is absent in the semiconductor light emitting device may be a minimum distance (X) of a portion covered with the passivation layer 1160 from the end of the light emitting device when the passivation layer 1160 is formed on the conductive electrode.

For a more specific example, the passivation layer 1160 includes a side surface portion 1162 covering a side surface of the semiconductor light emitting device and an extension portion 1163 extended from the side surface portion 1162 to cover the one end portion, and a width of the second portion 1055 may be a minimum width of the extension portion 1163. Here, the extension portion 1163 is formed in a hollow shape and has an outer circumference and an inner circumference, and a width of the second portion 1056 is a distance between the outer circumference and the inner circumference.

For such an example, a size of the semiconductor light emitting device may be formed in a size less than 100 micrometers×100 micrometers, and the shape thereof may be a circular, a triangular, a rectangular, or a polygonal shape having symmetry.

In this embodiment, there is presented a circular conductive electrode. According to the structure, a portion where the metal pad 1070 is exposed to the outside may be disposed at the center of the one end portion. For example, in case where the second portion 1056 is in a hollow circular shape as in the present example, the one end portion and the first portion 1055 may be formed in a circular shape. In this case, the portion where the metal pad 1070 is exposed to the outside may have a shape in which the one end portion is reduced to 25 to 75%.

Therefore, the first portion 1055 has the same shape as the portion where the metal pad 1070 is exposed to the outside. As a result, the portion where the metal pad 1070 is exposed to the outside may be circular, and a maximum width of the metal pad 1070 may be a diameter of the portion where the metal pad 1070 is exposed to the outside.

As illustrated in FIGS. 12A and 12B, when two semiconductor light emitting devices cover the metal pad 1070 since the maximum width of the metal pad 1070 is smaller than or equal to twice the second portion 1056, only the second portion 1056 is brought into contact with the metal pad 1070.

Therefore, the conductive electrodes of two semiconductor light emitting devices may be restricted from being brought into contact with one metal pad. In other words, it has a structure in which a diameter of the circular metal pad 1070 is all covered when two of the hollow second portions 1056 overlap, and thus becomes a structure in which two electrical connections cannot be made to one metal pad.

As described above, in case of assembling the semiconductor light emitting device to the substrate in a self-assembling manner, a display device according to the present example may assemble only one semiconductor light emitting device in a single self-assembly region.

Meanwhile, a display device using the semiconductor light emitting device described above may be modified into various forms. Hereinafter, these modified examples will be described.

Figure 14:
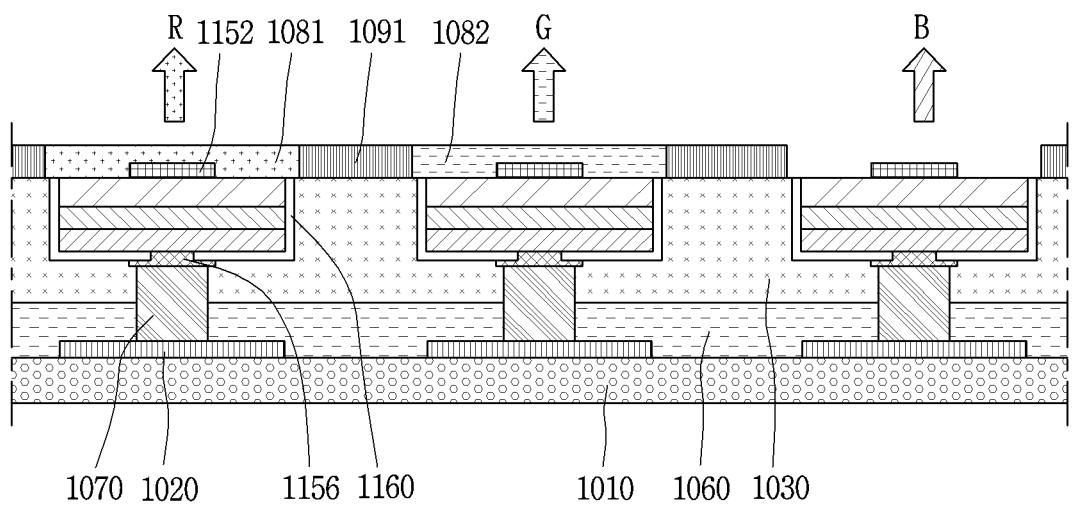
FIG. 14 is a cross-sectional view of a portion corresponding to line E-E in FIG. 10 in a display device according to another embodiment of the present invention.
Figure 15:
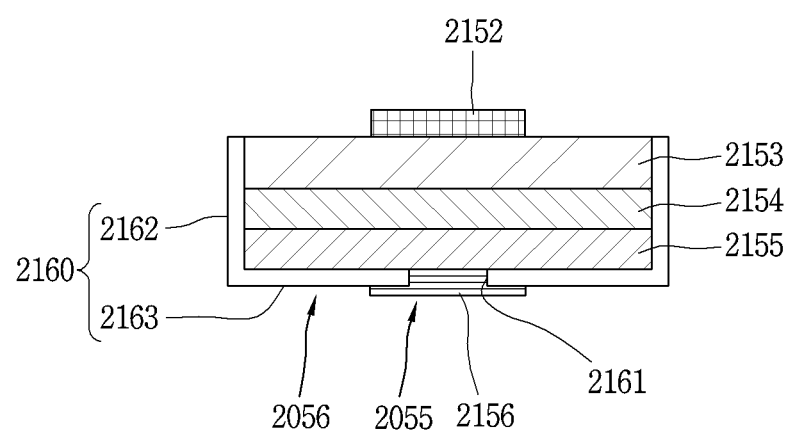
FIG. 15 is a conceptual view illustrating a flip chip type semiconductor light emitting device in FIG. 14.

FIG. 14 is a cross-sectional view of a portion corresponding to line E-E in FIG. 10 in a display device according to another embodiment of the present invention, and FIG. 15 is a conceptual view illustrating a flip chip type semiconductor light emitting device in FIG. 14.

According to the drawings, it is illustrated a display device 2000 using a passive matrix (PM) type vertical semiconductor light emitting device as a display device 2000 using a semiconductor light emitting device. However, the present example may also be applicable to an active matrix (AM) type semiconductor light emitting device.

In the present example to be described below, the same or similar reference numerals are designated to the same or similar components as those of the example described above with reference to FIGS. 10 through 13, and the description thereof will be substituted by the earlier description. For example, the display device 2000 includes a substrate 2010, a first electrode 2020, a planarizing layer 2030, a second electrode 2040, a plurality of semiconductor light emitting devices 2050, an insulating layer 2060, and metal pads 2070, and the descriptions thereof will be substituted by the description with reference to FIGS. 10 through 13 as described above. In addition, the display device of the present example may include a phosphor layer 2080 or a black matrix 2091, and the description thereof will also be substituted by the description with reference to FIGS. 10 to 13 as described above.

Referring to the present drawings, the semiconductor light emitting device 2050 includes a first conductive electrode 2156, a first conductive semiconductor layer 2155 formed with the first conductive electrode 2156, an active layer 2154 formed on the first conductive semiconductor layer 2155, a second conductive semiconductor layer 2153 formed on the active layer 2154, and a second conductive electrode 2152 formed on the second conductive semiconductor layer 2153. Furthermore, the semiconductor light emitting device may include a passivation layer 2160. In this case, the first conductive semiconductor layer 2155, the active layer 2154, the second conductive semiconductor layer 2153, and the second conductive electrode 2152, except for the first conductive electrode 2156 and the passivation layer 2160, may have the same structure as the above-described example, and the description thereof will be substituted by the description of the example with reference to FIGS. 10 through 13 as described above.

On the other hand, the semiconductor light emitting device includes a passivation layer 2160 formed to surround the lateral surfaces of the first conductive semiconductor layer 2155 and the second conductive semiconductor layer 2153. The passivation layer 2160 covers the lateral surface of the semiconductor light emitting device to stabilize the characteristics of the semiconductor light emitting device and is formed of an insulating material.

In this case, the passivation layer 2160 includes a through hole 2161 to expose the first conductive electrode 2156. The first conductive electrode 2156 protrudes through the through hole 2161 to be exposed to the outside. In this case, the first conductive electrode 2156 may include a plurality of metal layers made of different metals. For example, a plurality of metal layers made of Ti, Pt, Au, Ti, Cr or the like may be laminated to form the p-type electrode.

For example, one end portion of the semiconductor light emitting devices may be partitioned into a first portion 2055 in which the conductive electrode 2156 is exposed and a second portion 2056 in which the passivation layer 2160 is exposed. In the present example, the one end portion as a portion corresponding to a lower surface of the semiconductor light emitting devices may be a surface closest to the wiring substrate and a peripheral portion thereof.

According to the drawing, the first conductive electrode 2156 is exposed by the through hole 2161 of the passivation layer 2160, and thus the first portion 2055 may be a portion corresponding to a lower surface of the first conductive electrode 2156. Furthermore, the second portion 2055 as a region from an end of the first conductive electrode 2156 to an outer circumference of the passivation layer 2160 may be a region that is not covered by the first conductive electrode 2156 at the one end.

A maximum width (Y) of the metal pad 2070 may be set to a range of a width (X) of the second portion 2056 to twice the width to restrict a plurality of conductive electrodes from being brought into contact with one of the metal pads 2070. In this case, the width of the second portion 2056 may be the shortest distance from an end of the first conductive electrode 2156 to an outer circumference of the passivation layer 2160.

For a more specific example, the passivation layer 2160 includes a side surface portion 2162 covering a side surface of the semiconductor light emitting device and an extension portion 2163 extended from the side surface portion 2162 to cover the one end portion, and a minimum width of the second portion 2056 may be a minimum width of the exposed portion of the extension portion 2163. Here, a width of the second portion 2056 may be a distance from a protruding portion of the conductive electrode to the side surface portion 2162 in the extension portion 2163.

Even in the present example, X and Y are set to a range of $X \leq Y \leq 2X$, and through this, a condition that only one semiconductor light emitting device is assembled in a single self-assembly region is satisfied.

Meanwhile, the shapes of the conductive electrodes and metal pads of the present disclosure may be modified in various shapes. Hereinafter, these modified examples will be described with reference to drawings.

FIGS. 16A, 16B, 17A, 17B and 18 are plan views of a semiconductor light emitting device and a wiring substrate in display devices according to still another embodiment of the present disclosure.

Figure 16A:
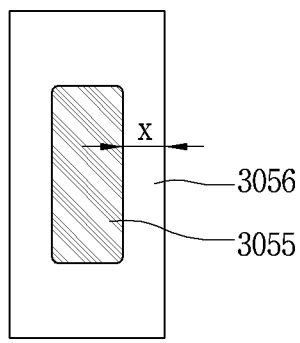
FIGS. 16A, 16B, 17A, 17B and 18 are plan views of a semiconductor light emitting device and a wiring substrate in display devices according to still another embodiment of the present disclosure.
Figure 16B:
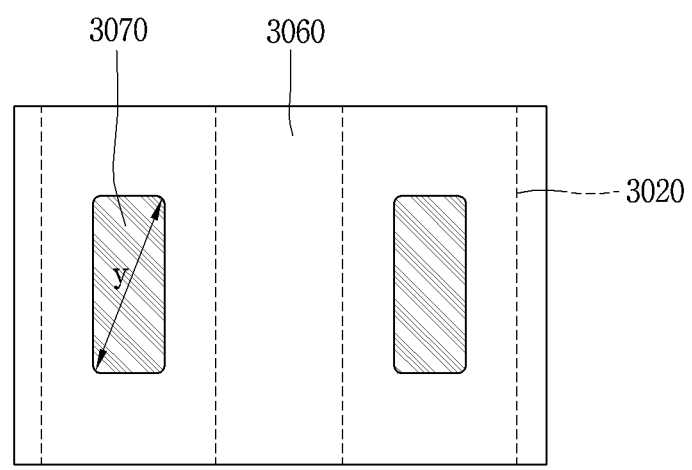

An embodiment described with respect to FIGS. 16A and 16B, there is presented a rectangular conductive electrode. According to the drawings, a portion where the metal pad is exposed to the outside may be disposed at the center of one end portion of the semiconductor light emitting device. Furthermore, the portion where the metal pad is exposed to the outside may have a shape in which the one end portion is reduced to 25 to 75%. In case where the second portion 3056 of the one end portion is in a hollow rectangular shape as in the present example, the one end portion and the first portion 3055 may be formed in a rectangular shape. In this case, a maximum width of the metal pad may be a diagonal distance of a portion where the metal pad is exposed to the outside.

Accordingly, in the present example, a diagonal distance of the portion where the metal pad is exposed to the outside is set to a range of a width (X) of the second portion 3056 to twice the width, as a maximum width (Y) of the metal pad.

Figure 17A:
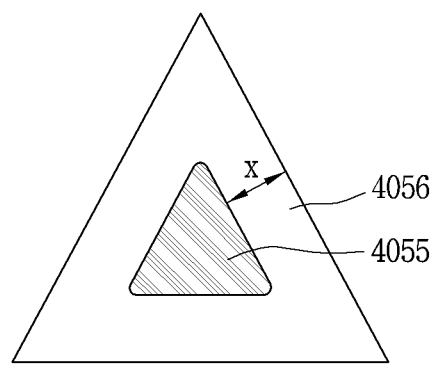
Figure 17B:
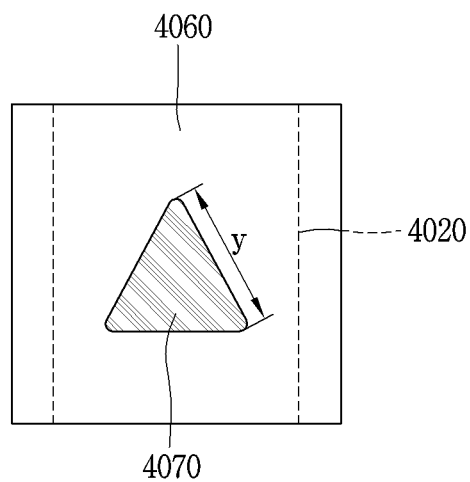

For another example, a triangular conductive electrode is presented in an embodiment with reference to FIGS. 17A and 17B. In case where the second portion 4056 of the one end portion is in a hollow triangular shape as in the present example, the one end portion and the first portion 4055 may be formed in a triangular shape. In this case, a maximum width of the metal pad may be one side distance of a portion where the metal pad is exposed to the outside.

Accordingly, in the present example, one side distance of the portion where the metal pad is exposed to the outside is set to a range of a width (X) of the second portion 4056 of the semiconductor light emitting device to twice the width, as a maximum width (Y) of the metal pad.

Figure 18:
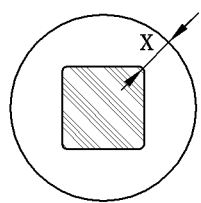
Figure 18:
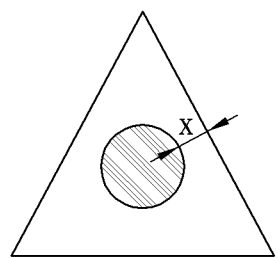
Figure 18:
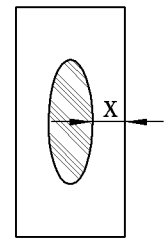
Figure 18:
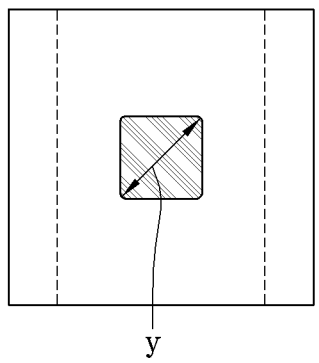
Figure 18:
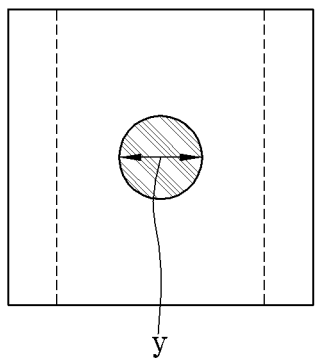
Figure 18:
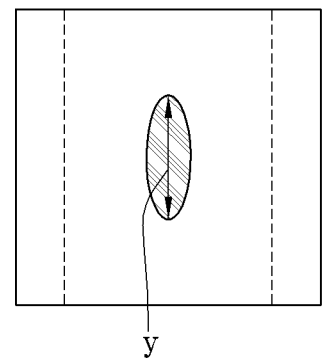

For another example, as illustrated in FIG. 18, a lower end portion of the semiconductor light emitting device may be formed in any one of a circular, a regular triangular, a square, a rectangular, and an elliptical shape, and the conductive electrode may be formed in any one of the circular, regular triangular, square, rectangular, and elliptical shapes. A portion where the metal pad is exposed to the outside is formed in a shape corresponding to the conductive electrode. In this case, the width (X) of the second portion of the semiconductor light emitting device may be a minimum distance among distances from the conductive electrode to an outer circumference of a lower end portion of the semiconductor light emitting device.

As described above, as an assembly region of the wiring substrate corresponding to the lower end portion of the semiconductor light emitting device has the same shape as that of a region where the conductive electrode of the semiconductor light emitting device is exposed, and a size thereof is set to $X \leq Y \leq 2X$, only one semiconductor light emitting device may be assembled in a single self-assembly region. Through this, when a plurality of semiconductor light emitting devices are coupled to one metal pad, a mechanism may be realized in which no electrical connection is made between the conductive electrode and the conductive pad.

On the other hand, the present disclosure may not necessarily be limited to the above-described structure to improve assembly reliability during the self-assembly process so as to secure production yield. If the above-described structure is used, the plurality of semiconductor light emitting devices may be 100 percent prevented from being coupled to one metal pad, but other structures or methods for improving the assembly reliability may also be used even without completely preventing the same. Fur such an example, a method of using a mating of a light emitting structure and a substrate may also be used. Hereinafter, another structure for improving assembly reliability during the self-assembly process will be described.

Figure 19:
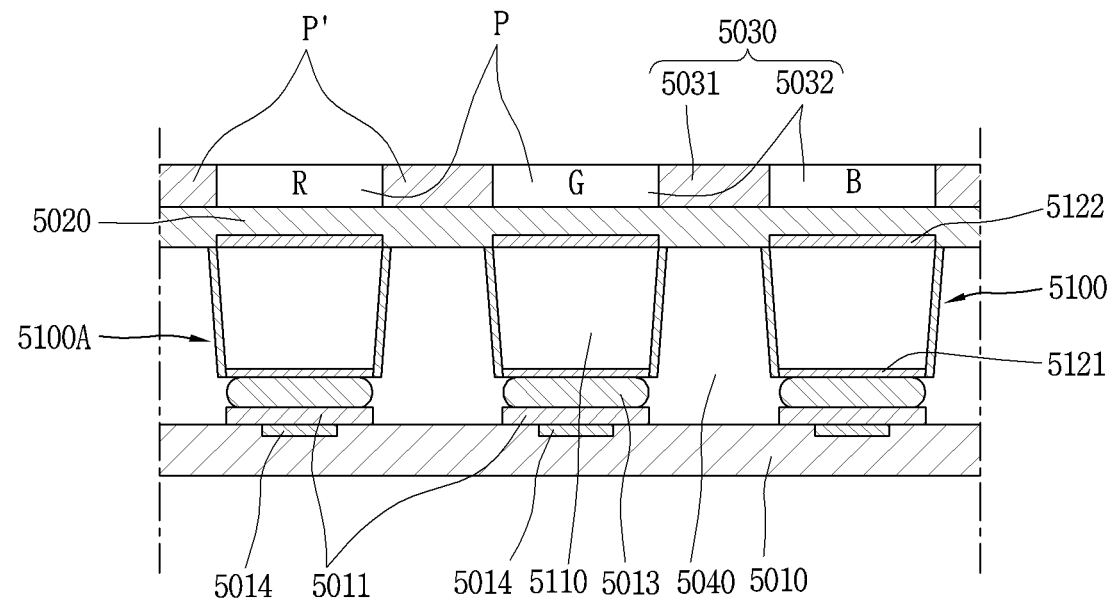
FIG. 19 is a cross-sectional view of a display device according to a first embodiment of the present disclosure that uses mating.
Figure 20:
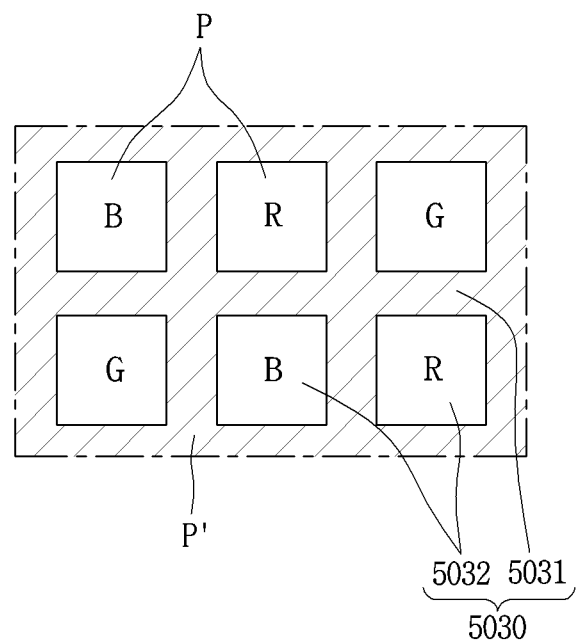
FIG. 20 is a plan view of a display device according to the first embodiment illustrated in FIG. 19.
Figure 21:
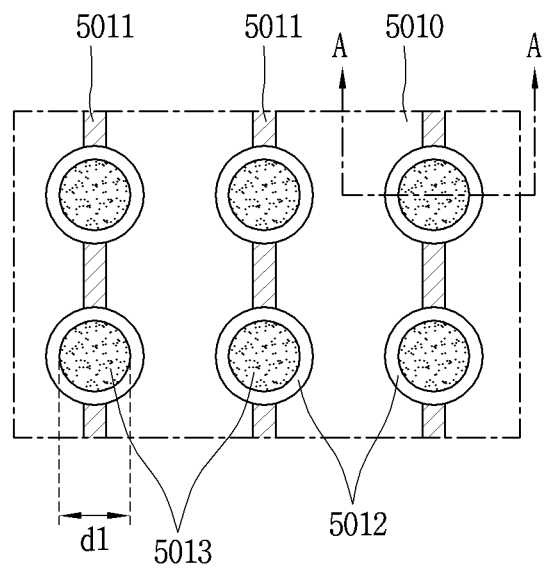
FIG. 21 is a plan view of a lower substrate according to the first embodiment of the present disclosure.
Figure 22:
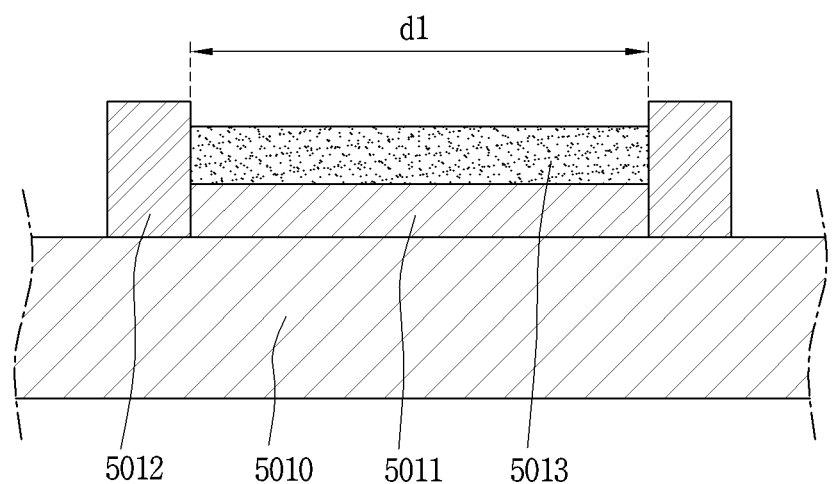
FIG. 22 is a cross-sectional view taken along line A-A of the lower substrate illustrated in FIG. 21.

FIG. 19 is a cross-sectional view of a display device according to a first embodiment of the present disclosure that uses mating, FIG. 20 is a plan view of a display device according to the first embodiment illustrated in FIG. 19, FIG. 21 is a plan view of a lower substrate according to the first embodiment of the present disclosure, and FIG. 22 is a cross-sectional view taken along line A-A of the lower substrate illustrated in FIG. 21.

Referring to FIGS. 19 through 22, a display device according to the first embodiment includes a lower substrate 5010 at an upper portion of which a lower wiring 5011 is disposed, and at least two light emitting devices 5100 having a first electrode 5121 electrically connected to the lower wiring 5011 and a light emitting structure 5110 configured to generate light.

Furthermore, the display device according to the first embodiment further includes a second electrode 5122 located on the second conductive semiconductor layer 5113, an upper wiring 5020 electrically connected to the second electrode 5122, and a color substrate 5030 disposed on the light emitting device 5100 to convert a wavelength of light generated from the light emitting device 5100.

The lower substrate 5010 may have a film shape of an insulating material. For example, the lower substrate 5010 may be made of a transparent glass material, or may be made of a transparent plastic or a polymer film having excellent flexibility.

On the lower substrate 5010, the lower wiring 5011 is disposed. The lower wiring 5011 is electrically connected to the light emitting device 5100 to supply driving power to the light emitting device 5100. The lower wiring 5011 corresponds to at least a position corresponding to the light emitting device 5100 on the lower substrate 5010. Specifically, the lower wiring 5011 is disposed in a line shape on a plane, as illustrated in FIG. 3, in order to supply driving power to a plurality of light emitting devices 5100. The light emitting device 5100s are arranged at a constant pitch on the lower wiring 5011 disposed in a line shape. For another example, the lower wiring 5011 is disposed in a point shape on a plane.

The lower wiring 5011 may include a conductive material, and for example, may include a metal selected from a group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or may include an alloy thereof, and may be formed as a single layer or multi-layer. Furthermore, the lower wiring 5011 may be formed of a light transmitting material, and for example, may be formed of at least one of ITO, IZO(In—ZnO), GZO(Ga—ZnO), AZO(Al—GaZO), AGZO(Al—Ga ZnO), IGZO(In—Ga ZnO), $IrO_x$, $RuO_x$, $RuO_x$/ITO, Ni/$IrO_x$/Au and Ni/$IrO_x$/Au/ITO.

The lower wiring 5011 forms the foregoing conductive material on the lower substrate 5010 using a deposition method such as sputtering. Then, a metal layer may be patterned and formed by a photolithography process and an etching process using a mask.

The lower wirings 5011 may be arranged so as to intersect with each other, and a switching device (not shown) may be located at the foregoing intersection point. The lower wiring 5011 may be disposed in consideration of a pixel region (P) which will be described later.

The lower wiring 5011 is electrically connected to the first electrode 5121 of the light emitting device 5100, and a metal bonding layer 5013 is used to reinforce an adhesive force between the lower wiring 5011 and the first electrode 5121.

The metal bonding layer 5013 is disposed on the lower wiring 5011 to correspond to the pixel region (P) where the respective light emitting devices 5100 are located. The metal bonding layer 5013 bonds the lower wiring 5011 to the first electrode 5121.

In addition, the metal bonding layer 5013 may be formed of a material with which a capillary force acts on the first electrode 5121. The plurality of light emitting devices 5100 are aligned on the lower wiring 5011 to correspond to the pixel regions (P) by a capillary force acting between the metal bonding layer 5013 and the first electrode 5121.

Specifically, the lower substrate 5010 on which the metal bonding layer 5013 is disposed is placed in a solution containing a larger number of the light emitting devices 5100 than that of the pixel regions (P), and the light emitting devices 5100 are self-aligned by a capillary force between the metal bonding layer 5013 and the first electrode 5121 while vibrating.

When heat is applied to the metal bonding layer 5013, the metal bonding layer 5013 is melted to bond the first electrode 5121 to the lower wiring 5011. The metal bonding layer 5013 has a melting point temperature of 45° C. to 300° C. Preferably, a metal solder between 150° C. and 300° C. is used to withstand the driving conditions of the display device and the temperature of the post-processes. Thus, self-alignment is carried out at a melting point temperature of the metal bonding layer 5013. More preferably, the melting point temperature of the metal bonding layer 5013 is formed to be lower than the melting point temperature of the first electrode 5121.

The metal bonding layer 5013 includes a conductive material. For example, the metal bonding layer 5013 may be at least one element of Sn, Ag, Cu, Pb, Al, Bi, Cd, Fe, In, Ni, Sb, Zn, Co, and Au or a compound of these elements with an eight-component system or less. Preferably, the metal bonding layer 5013 is at least one element of Cu, Pb, Al, Fe, and Ni or a compound of these elements.

The metal bonding layer 5013 is formed on the lower wiring 5011 with a deposition method such as sputtering. Then, a metal layer may be patterned and formed by a photolithography process and an etching process using a mask.

When the metal bonding layer 5013 is melted, the metal bonding layer 5013 arranged on the lower wiring 5011 expands more than the set size so that two or more light emitting devices 5100 are coupled to the metal bonding layer 5013. In order to prevent this, a positioning partition wall 5012 is positioned at an upper portion of the lower substrate 5010.

The positioning partition wall 5012 defines a space in which the metal bonding layer 5013 is accommodated. In addition, the positioning partition wall 5012 determines a position at which the first electrode 5121 of the light emitting device 5100 is aligned. The positioning partition wall 5012 serves as a wall for preventing the metal bonding layer 5013 from extending beyond a predetermined size. Furthermore, the positioning partition wall 5012 holds a shape of the metal bonding layer 5013. Therefore, the metal bonding layer 5013 has a shape corresponding to the shape of the light emitting device 5100 to easily align the light emitting device 5100 and restrict two or more light emitting devices 5100 from being coupled to each other.

Moreover, a center region (S1) of the light emitting structure 5110 is inserted into a space defined by the positioning partition wall 5012. The shape of a space defined by the positioning partition wall 5012 has a shape into which the center region (S1) is inserted. When the center region (S1) is inserted into the space defined by the positioning partition wall 5012, a probability of correct alignment of the light emitting device 5100 is increased. The center of the light emitting device 5100 is aligned with the center of the metal bonding layer 5013 even though the light emitting device 5100 is contacted by a capillary force due to a mating of the center region (S1) with the positioning partition wall 5012.

More specifically, the positioning partition wall 5012 has a shape that accommodates part of the lower wiring 5011 and protrudes upward from the lower wiring 5011. For example, as illustrated in FIG. 22, the positioning partition wall 5012 may be a wall protruding upward from the lower substrate 5010. For another example, an upper portion of the lower substrate 5010 may be depressed downward to form the positional partition wall 5012. However, considering the arrangement of the lower wiring 5011 on the lower substrate 5010 or the like, the positioning partition wall 5012 preferably has a wall shape protruding from the lower substrate 5010.

In particular, referring to FIG. 21, the positioning partition wall 5012 is disposed on the lower substrate 5010 at a position corresponding to the pixel region (P) where the light emitting devices 5100 are to be located to determine a region where the first electrode 5121 is bonded to the metal bonding layer 5013. The metal bonding layer 5013 is accommodated in a space defined by the positioning partition wall 5012 on a plane.

The positioning partition wall 5012 has a shape that forms a closed space on a plane. The positioning partition wall 5012 is disposed to surround the metal bonding layer 5013 on a plane. The shape of the positioning partition wall 5012 on the plane has a ring shape.

Specifically, in order to prevent misalignment of the light emitting device 5100, an inner space defined by the positioning partition wall 5012 is formed to correspond to the center region (S1) of the light emitting structure 5110 which will be described later. The inner space defined by the positioning partition wall 5012 has a circular shape. A diameter (d1) of the inner space defined by the positioning partition wall 5012 is formed to be larger than a diameter (d2) of the center region (S1). Preferably, the diameter (d1) of the inner space defined by the positioning partition wall 5012 may be 90% to 120% compared to a diameter (d3) of the center region (S1). For another example, the positioning partition wall 5012 is continuously disposed on a boundary line surrounding the center region (S1) as viewed from above.

The positioning partition wall 5012 is made of a resin material having electrical insulation.

The upper wiring 5020 supplies driving power to the light emitting device 5100. The upper wiring 5020 supplies driving power having an opposite polarity to the lower wiring 5011.

Specifically, the upper wiring 5020 is electrically connected to the second electrode 5122 of the light emitting device 5100. The upper wiring 5020 is located on the second electrode 5122. The upper wiring 5020 is disposed to be vertically overlapped with at least the second electrode 5122. The upper wiring 5020 is disposed in a line shape on a plane.

The upper wiring 5020 may include a conductive material, and for example, may include a metal selected from a group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, or may include an alloy thereof, and may be formed as a single layer or multi-layer. Preferably, the upper wiring 5020 may be formed of a material that transmits light generated from the light emitting device 5100, and for example, may be formed of at least one of ITO, IZO(In—ZnO), GZO(Ga—ZnO), AZO(Al—GaZO), AGZO(Al—Ga ZnO), IGZO(In—Ga ZnO), $IrO_x$, $RuO_x$, $RuO_x$/ITO, Ni/$IrO_x$/Au and Ni/$IrO_x$/Au/ITO.

The upper wiring 5020 forms the foregoing conductive material on the second electrode 5122 using a deposition method such as sputtering. Then, a metal layer may be patterned and formed by a photolithography process and an etching process using a mask.

Of course, in order to arrange a line-shaped upper wiring 5020, a void between the respective light emitting devices 5100 is filled with a molding material 5040. An upper surface of the light emitting device 5100 is planarized by the molding material 5040. The molding material 5040 is made of transparent silicone or the like which transmits light.

In particular, referring to FIG. 20, a color substrate 5030 is disposed on the light emitting device 5100 to change a wavelength of light generated from the light emitting device 5100. In addition, one region of the color substrate 5030 may shield light, and another one region may transmit light to be partitioned into a plurality of pixel regions (P) and out-of-pixels regions (P').

The plurality of pixel regions (P) may be arranged in a matrix type having rows and columns. A black matrix 5031 is disposed at a predetermined interval in an out-of-pixel region (P') of the color substrate 5030 to define a pixel region (P).

For example, the color substrate 5030 may include a black matrix 5031 and a color substrate 5030, 5031.

The black matrix 5031 is formed in the form of a matrix on the color substrate 5030. The black matrix 5031 divides a region of the color substrate 5030 into a plurality of pixel regions (P) where the color filter 5032 is to be formed, and prevents light interference and external light reflection between adjacent pixel regions (P).

A plurality of color filters 5032 (R, G, B) are located in the pixel region (P) corresponding to a space between the black matrices 5031.

The color filter 5032 is formed to be divided into red, green, and blue color filters 5032 (R, G, B) in the pixel region (P) divided by the black matrix 5031 to transmit red, green and blue light, respectively. The red, green, and blue color filters 5032 (R, G, B) for expressing colors may be arranged in a stripe shape along the respective column directions.

The black matrix 5031 may include a material for blocking light, for example, a non-light transmitting synthetic resin.

The color filter 5032 may be arranged vertically (refer to FIG. 19) to overlap with the plurality of light emitting devices 5100. Furthermore, the black matrix 5031 may be disposed so as not to vertically overlap with the plurality of light emitting devices 5100. Therefore, most of the light generated from he light emitting device 5100 is emitted to the outside through the color filter 5032, thereby improving the efficiency and brightness of the display device.

The color filter 5032 may include a phosphor that converts the wavelength of light generated from the light emitting device 5100. For example, in the color filter 5032, at least one phosphor may be selected depending on the wavelength of light to be implemented.

For such a phosphor, one of a blue light emitting phosphor, a cyan light emitting phosphor, a green light emitting phosphor, a yellowish green light emitting phosphor, a yellow light emitting phosphor, a yellowish red light emitting phosphor, an orange light emitting phosphor, and a red light emitting phosphor may be applied depending on the wavelength of light emitted from the light emitting device 5100.

In other words, the phosphor may be excited by light having first light emitted from the light emitting device 5100 to generate second light.

For example, when the light emitting device 5100 is a blue light emitting diode and the phosphor is a yellow phosphor, the yellow phosphor may be excited by blue light to emit yellow light.

Such a phosphor may be a known fluorescent material such as YAG-based, TAG-based, sulfide-based, silicate-based, aluminate-based, nitride-based, carbide-based, nitridosilicate-based, borate-based, fluoride-based or phosphate-based.

Of course, for another example, the color substrate 5030 may be omitted and each light emitting device 5100 may be configured to emit red, green, and blue light. However, in this case, there is a problem that it is difficult to align the light emitting device 5100 of the color corresponding to each pixel region (P).

Figure 23:
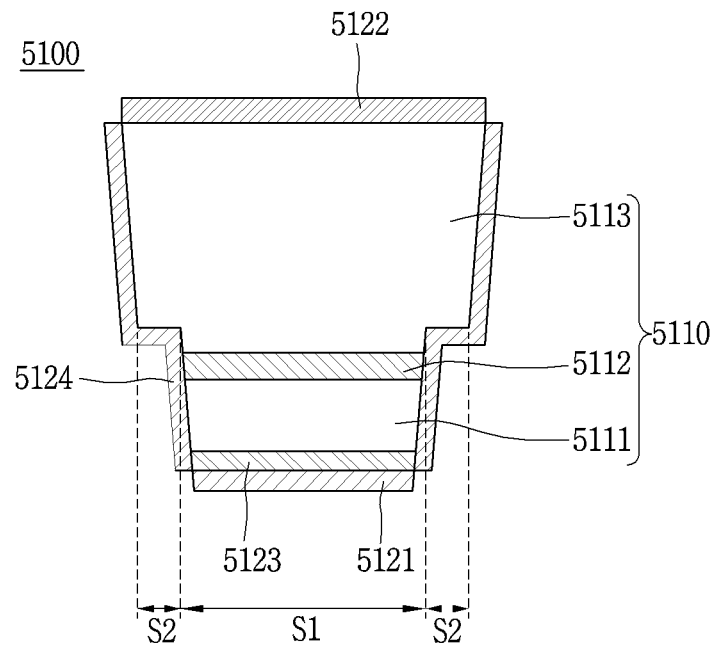
FIG. 23 is a cross-sectional view of a light emitting device according to the first embodiment of the present disclosure.
Figure 24:
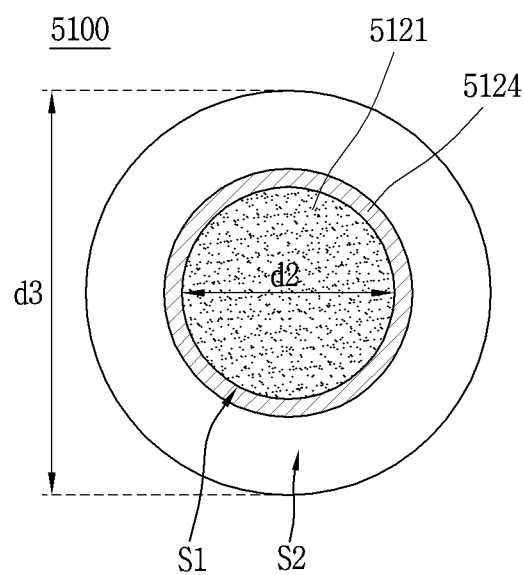
FIG. 24 is a plan view of a light emitting device according to the first embodiment of the present disclosure.

FIG. 23 is a cross-sectional view of a light emitting device according to the first embodiment of the present disclosure, and FIG. 24 is a plan view of a light emitting device according to the first embodiment of the present disclosure.

The plurality of light emitting devices 5100 are positioned on the lower wiring 5011 to correspond to the pixel regions P. Specifically, the light emitting devices 5100 are aligned and adhered by a capillary force on the metal bonding layer 5013 positioned to correspond to each pixel region (P).

The light emitting device 5100 includes a first electrode 5121, a second electrode 5122, and a light emitting structure 5110 that generates light.

The light emitting device 5100 may be an inorganic semiconductor selected from a semiconductor material having a composition formula of $In_xAl_yGa_{1-x-y}N$ ($0 \leq x \leq 1$, $0 \leq y \leq 1$, $0 \leq x+y \leq 1$).

In case of LCD (Liquid Crystal Display), there is a non-fast response time and a high efficiency of the backlight unit is lowered to cause a large power consumption, and in case of OLED (Organic Light Emitting Diodes) there is a problem that the lifespan cannot be guaranteed for 2 years or more and the mass-production yield is not very good.

According to an embodiment, there is an advantage in that the inorganic light emitting device 5100 is disposed in the pixel region (P) to realize a high-speed screen at a fast response speed. In addition, a separate backlight unit may not be required, thereby having an advantage of excellent brightness and excellent efficiency.

Furthermore, the light emitting device 5100 is an inorganic material and thus has a long lifespan. Moreover, the light emitting devices 5100 may be arranged in the unit of pixels, thereby having an advantage in that it can be easily implemented in an active manner.

The light emitting device 5100 may emit ultraviolet ray (UV) region or blue light. The light having a short wavelength may have an advantage in that light of high luminance can be obtained with a low voltage since the luminance is excellent.

The light emitting device 5100 may be formed using a metal organic chemical vapor deposition (MOCVD) method, a chemical vapor deposition (CVD) method, a plasma enhanced chemical vapor deposition (PECVD) method, a molecular beam epitaxy (MBE), a hydride vapor phase epitaxy (HVPE) method, sputtering, or the like, but the present disclosure may not be limited thereto.

For example, the light emitting structure 5110 includes a first conductive semiconductor layer 5111, an active layer 5112 positioned on the first conductive semiconductor layer 5111, and a second conductive semiconductor layer 5113 positioned on the active layer 5112.

The first conductive semiconductor layer 5111 may be formed of a semiconductor compound and may be doped with a first conductive dopant. For example, the first conductive semiconductor layer 5111 may be formed of an n-type semiconductor layer to provide electrons to the active layer 5112. The first conductive semiconductor layer 5111 may be selected from semiconductor materials having a composition formula of, for example, $In_xAl_yGa_{1-x-y}N$ ($0 \leq x \leq 1$, $0 \leq y \leq 1$, $0 \leq x+y \leq 1$) GaN, AlN, AlGaN, InGaN, InN, InAlGaN, AlInN and the like, and an n-type dopant such as Si, Ge, Sn, Se and Te may be doped.

An active layer 5112 may be formed on the first conductive semiconductor layer 5111. The active layer 5112 may be formed of a single or multiple quantum well structure, a quantum-wire structure, a quantum dot structure, or the like using a compound semiconductor material of Group 3-5 elements.

When the active layer 5112 is formed of a quantum well structure, for example, it may have a well layer with a composition formula of $In_xAl_yGa_{1-x-y}N$ ($0 \leq x \leq 1$, $0 \leq y \leq 1$, $0 \leq x+y \leq 1$) and a single or multiple quantum well structure having a barrier layer with a composition formula of $In_aAl_bGa_{1-a-b}N$ ($0 \leq a \leq 1$, $0 \leq b \leq 1$, $0 \leq a+b \leq 1$). The well layer may be formed of a material having a band gap smaller than the that of the barrier layer.

Furthermore, when the active layer 5112 has a multiple quantum well structure, each well layer (not shown) may have different In contents and different band gaps, which will be described later with reference to FIG. 20.

A conductive clad layer (not shown) may be formed on and/or below the active layer 5112. The conductive clad layer (not shown) may be formed of a semiconductor, and may have a band gap larger than that of the active layer 5112. For example, the conductive clad layer (not shown) may be formed to include AlGaN.

The second conductive semiconductor layer 5113 may be formed of a semiconductor compound to inject holes into the active layer 5112 and doped with a second conductive dopant. For example, the second conductive semiconductor layer 5113 may be implemented as a p-type semiconductor layer. The second conductive semiconductor layer 5113 may be selected from semiconductor materials having a composition formula of, for example, $In_xAl_yGa_{1-x-y}N$ ($0 \leq x \leq 1$, $0 \leq y \leq 1$, $0 \leq x+y \leq 1$) GaN, AlN, AlGaN, InGaN, InN, InAlGaN, AlInN and the like, and a p-type dopant such as Mg, Zn, Ca, Sr and Ba may be doped.

Meanwhile, an intermediate layer (not shown) may be formed between the active layer 5112 and the second conductive semiconductor layer 5113, and the intermediate layer may prevent electrons injected from the first conductive semiconductor layer 5111 to the active layer 5112 from flowing to the second conductive semiconductor layer 5113 without being recombined in the active layer 5112. The intermediate layer may have a band gap relatively larger than that of the active layer 5112, thereby preventing electrons injected from the first conductive semiconductor layer 5111 from being injected into the second conductive semiconductor layer 5113 without being recombined in the active layer 5112. Accordingly, it may be possible to increase a probability of recombination of electrons and holes in the active layer 5112 and prevent a leakage current.

Furthermore, the first conductive semiconductor layer 5111 may be implemented as a p-type semiconductor layer, and the second conductive semiconductor layer 5113 may be implemented as an n-type semiconductor layer, and a third semiconductor layer (not shown) including an n-type or p-type semiconductor layer opposite to the polarity of the second conductive semiconductor layer 5113 may be formed on the second conductive semiconductor layer 5113. Accordingly, the light emitting device may have at least one of np, pn, npn, and pnp junction structures. The light emitting device 5100 of the embodiment is implemented as a vertical type in which electrodes are formed at a lower portion and a upper portion of the light emitting structure 5110, and the first conductive semiconductor layer 5111 is implemented as a p-type semiconductor layer, and the second conductive semiconductor layer 5113 is implemented as an n-type semiconductor layer.

Meanwhile, the first electrode 5121 electrically connected to the first conductive type semiconductor layer 5111 may be disposed on the first conductive semiconductor layer 5111. For example, the first electrode 5121 may be formed at a lower portion of the first conductive semiconductor layer 5111. The first electrode 5121 is bonded to the lower wiring 5011 by the metal bonding layer 5013.

Furthermore, the second electrode 5122 electrically connected to the second conductive semiconductor layer 5113 may be disposed on the second conductive semiconductor layer 5113. Specifically, the second electrode 5122 is positioned on the second conductive semiconductor layer 5113.

The first electrode 5121 and the second electrode 5122 may be formed by a deposition method such as sputtering. However, the present disclosure is not limited thereto.

On the other hand, the first electrode 5121 and the second electrode 5122 may include a metal selected from a group consisting of In, Co, Si, Ge, Au, Pd, Pt, Ru, Re, Mg, Zn, Hf, Ta, Rh, Ir, W, Ti, Ag, Cr, Mo, Nb, Al, Ni, Cu, and WTi, for example, or may include an alloy thereof, and may be formed as a single layer or multi-layer, but the present disclosure may not be limited thereto. Preferably, the first electrode 5121 is made of any one element of Au, Pt, and Ag, or an alloy thereof.

In addition, a bonding layer (not shown) for bonding the first electrode 5121 to the first conductive semiconductor layer 5111 is formed between the first electrode 5121 and the first conductive semiconductor layer 5111. The bonding layer may include any one of a PbSn alloy, an AuGe alloy, an AuBe alloy, an AuSn alloy, Sn, In, and a PdIn alloy.

Moreover, the first electrode 5121 may further include a conductive reflective layer 5123 that reflects light incident from the active layer 5112.

When light generated from the active layer 5112 propagates to the lower substrate 5010, the light is reflected by the reflective layer 5123 without being absorbed by the first electrode 5121, thereby preventing the degradation of luminance and brightness generated due to light absorbed by the first electrode 5121.

The light emitting structure 5110 includes a center region (S1) in which the first electrode 5121 is located and a peripheral region (S2) formed to surround the center region (S1).

From the bottom, the center region (S1) is disposed at the center of the light emitting structure 5110 and positioned inside the peripheral region (S2). The peripheral region (S2) defines a closed space for accommodating the center region (S1) therein.

The center region (S1) and the peripheral region (S2) have step differences. Specifically, the center region (S1) has a step protruding downward from the peripheral region (S2). A region where the first electrode 5121 is located is smaller than a lower region of the light emitting structure 5110, and positioned inward from a lower edge of the light emitting structure 5110. Therefore, a plurality of light emitting devices 5100 are prevented from being aligned in one pixel region (P). In other words, a width (d1) of the center region (S1) in which the first electrode 5121 is located is formed to be smaller than a width (d3) of the light emitting structure 5110, and the metal bonding layer 5013 is formed to correspond to the first electrode 5121 even when the side surfaces of the plurality of light emitting devices 5100 are in contact with each other, thereby reducing a probability that the plurality of light emitting devices 5100 are coupled to one metal bonding layer 5013.

A step between the center region (S1) and the peripheral region (S2) may be formed by depositing a semiconductor layer below the light emitting structure 5110 or formed by etching the peripheral region (S2) of the light emitting structure 5110 upward.

There is no limitation on a step between a lower surface of the center region (S1) and a lower surface of the peripheral region (S2). Preferably, a step between a lower surface of the center region (S1) and a lower surface of the peripheral region (S2) is 500 nm to 7000 nm. It is because when the step between a lower surface of the center region (S1) and a lower surface of the peripheral region (S2) is less than 500 nm, the light emitting structure is easily released even though the center region (S1) is inserted into the positioning partition wall 5012, and when he step between a lower surface of the center region (S1) and a lower surface of the peripheral area (S2) is larger than 7000 nm, the efficiency of the light emitting device 5100 is lowered. Here, the first electrode 5121 is disposed on a lower surface of the center region (S1).

Specifically, at least a side surface of the first conductive semiconductor layer 5111 is formed to be exposed at a boundary between the center region (S1) and the peripheral region (S2). Preferably, at least the first conductive semiconductor layer 5111, a side surface of the active layer 5112 and a part of a side surface of the second conductive semiconductor layer 5113 are exposed at a boundary between the center region (S1) and the peripheral region (S2). The center region (S1) may be formed by etching a lower edge of the light emitting structure 5110.

A planar width or diameter of the light emitting structure 5110 is larger than those of the center region (S1). The planar width or diameter of the center region (S1) is preferably 50% to 85% of those of the light emitting structure 5110. The width of the peripheral region (S2) is equally formed along the circumference of the center region (S1).

The shape of the light emitting structure 5110 viewed from below includes any one of a rectangular shape, a polygonal shape, and a circular shape. Preferably, when the light emitting structure 5110 is densely arranged on a plane, a shape having a large void ratio is preferable. Therefore, it is preferable that a planar shape of the light emitting structure 5110 has a polygonal shape more than a hexagonal shape or circular shape.

The shape of the center region (S1) viewed from below includes any one of a rectangular shape, a polygonal shape, and a circular shape. The planar shape of the center region (S1) may correspond to a planar shape of the light emitting structure 5110, or may have different shapes. However, in order to prevent the plurality of light emitting devices 5100 from being arranged in one pixel region (P), a planar shape of the center region (S1) and a planar shape of the light emitting structure 5110 are preferably the same. Therefore, it is preferable that the planar shape of the center region (S1) has a polygonal shape more than a hexagonal shape or circular shape arranged at the center of a lower surface of the light emitting structure 5110.

The shape of the peripheral region (S2) viewed from below is determined by the shape of the center region (S1) and the shape of the light emitting structure 5110. The shape of the peripheral region (S2) seen from the bottom has a ring shape. The peripheral region (S2) serves as a buffer for preventing an electrode of the light emitting device 5100 located in the periphery of the pixel region (P) from being in contact with the metal bonding layer 5013 or the lower wiring 5011 of the pixel region (P).

Furthermore, the light emitting device 5100 further includes an insulating layer 5124. The insulating layer 5124 prevents the lower wiring 5011 from being electrically connected to other layers except for the first conductive semiconductor layer 5111. Specifically, the insulating layer 5124 covers a side surface of the light emitting structure 5110. More specifically, the insulating layer 5124 is arranged to surround the periphery of the center region (S1) and the periphery of the peripheral region (S2), and disposed at a lower portion of the peripheral region (S2). The insulating layer 5124 includes a resin material formed of an electrically insulating material.

Figure 25A:
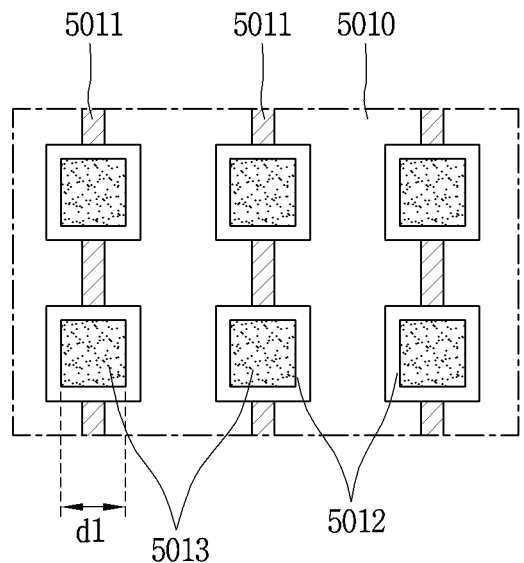
FIGS. 25A and 25B are views illustrating the modified examples of positioning partition walls according to the first embodiment of the present disclosure.
Figure 25B:
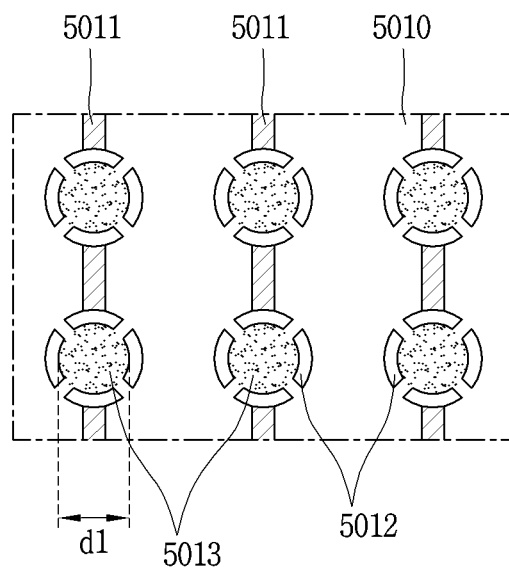

FIGS. 25A and 25B are views illustrating the modified examples of positioning partition walls according to the first embodiment of the present disclosure.

Referring to FIG. 25A, there exists a difference from the positioning partition wall 5012 of the first embodiment in the shape in FIG. 25A. A planar shape of the positioning partition wall 5012 according to a modified example of FIG. 25A is polygonal. Specifically, the planar shape of the positioning partition wall 5012 is rectangular. Here, the planar shape of the center region (S1) is also formed as a rectangle.

Referring to FIG. 25B, there exists a difference from the positioning partition wall 5012 of the first embodiment in the shape in FIG. 25B. The positioning partition wall 5012 according to a modified example of FIG. 25B is disposed discontinuously on a boundary line surrounding the center region (S1) as viewed from above.

Figure 26A:
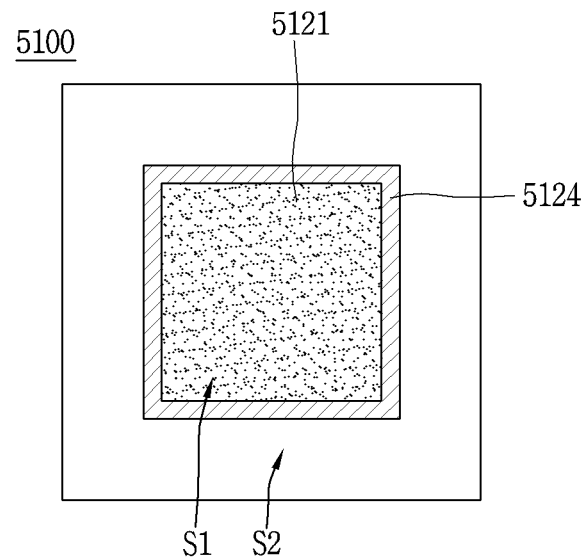
FIGS. 26A and 26B are views illustrating the modified examples of a light emitting device according to the first embodiment of the present disclosure.
Figure 26B:
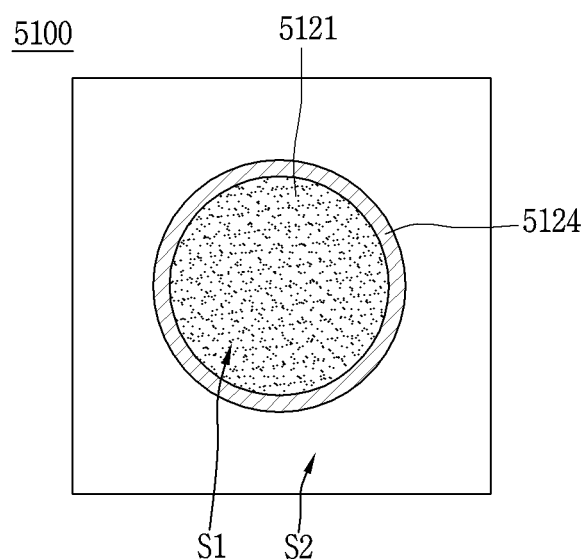

FIGS. 26A and 26B are views illustrating the modified examples of a light emitting device according to the first embodiment of the present disclosure.

Referring to FIG. 26A, there exists a difference in the shape of the light emitting device 5100 as compared to the first embodiment in FIG. 26A. A planar shape of the light emitting structure 5110 according to a modified example of FIG. 26A is polygonal. Specifically, the planar shape of the light emitting structure 5110 is rectangular.

Furthermore, the planar shape of the center region (S1) has a rectangle corresponding to the shape of the light emitting structure 5110.

Referring to FIG. 26B, there is a difference in the shape of the light emitting device 5100 as compared to the first embodiment in FIG. 26B. The planar shape of the light emitting structure 5110 according to a modification example of FIG. 26A is rectangular, and the planar shape of the center region (S1) is circular.

FIGS. 27A through 27D are flowcharts illustrating a method of fabricating a display device according to the first embodiment of the present disclosure.

Figure 27A:
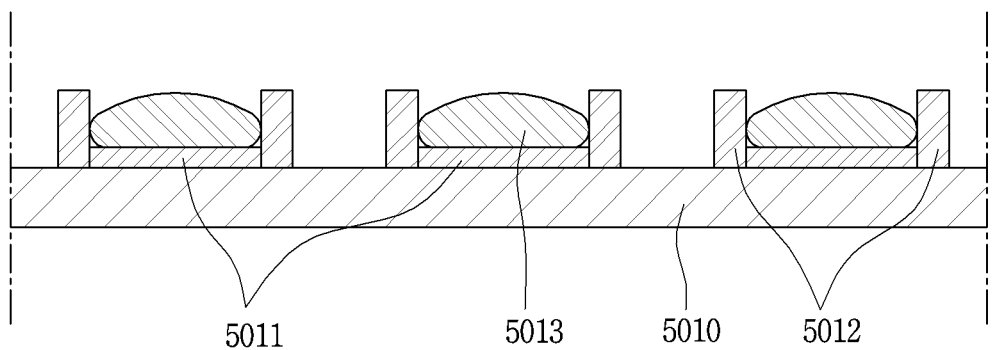
FIGS. 27A through 27D are flowcharts illustrating a method of fabricating a display device according to the first embodiment of the present disclosure.

Referring to FIG. 27A, first, a lower substrate 5010 having an upper wiring 5011 disposed thereon is prepared. The positioning partition wall 5012 is formed on the lower substrate 5010. The metal bonding layer 5013 is positioned inside a space defined by the positioning partition wall 5012.

Figure 27B:
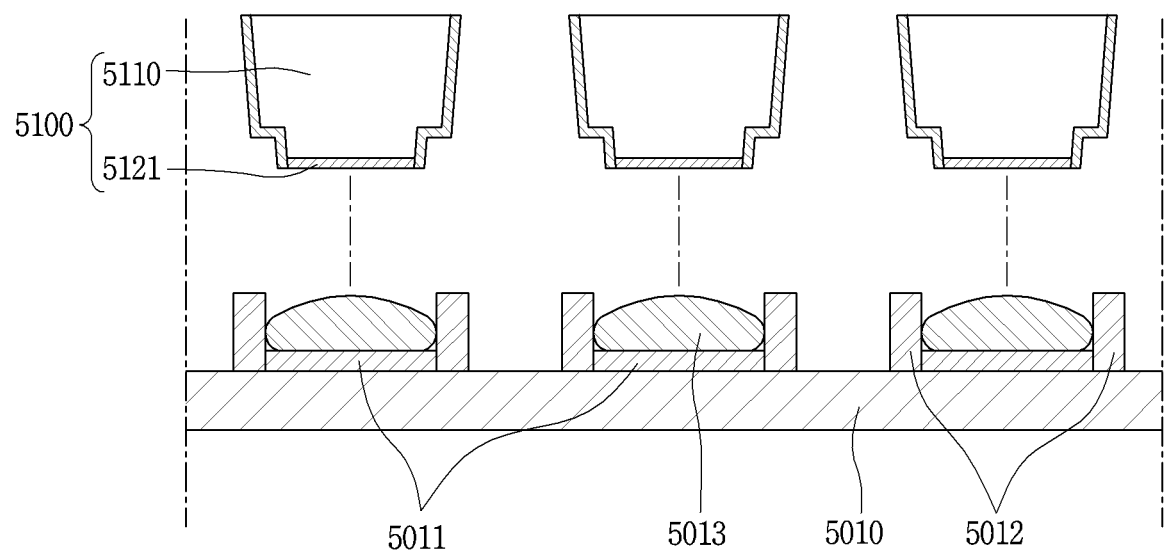
Figure 27C:
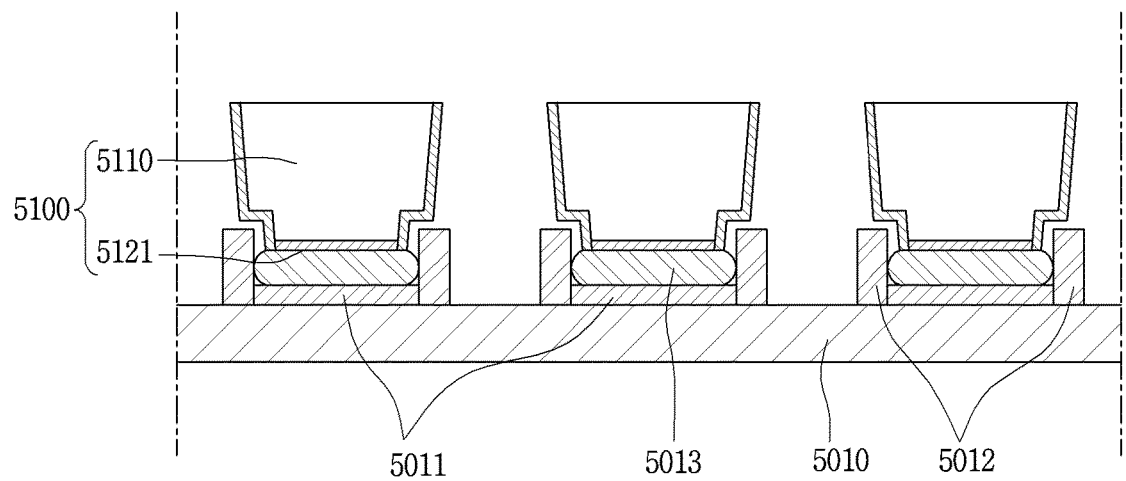

Referring to FIGS. 27B and 27C, a plurality of light emitting devices 5100 are aligned with respective pixel regions (P) by a capillary force acting between the metal bonding layer 5013 and the first electrode 5121 of the light emitting device 5100. Specifically, a lower substrate 5010 formed with a metal bonding layer 5013 is placed in a container containing a solution containing a plurality of light emitting devices 5100, and vibration is applied thereto. The light emitting device 5100 is aligned with each pixel region (P) by a capillary force acting between the metal bonding layer 5013 and the first electrode 5121 of the light emitting device 5100 in the solution. At this time, heat is applied to melt the metal bonding layer 5013. The first electrode 5121 is bonded onto the lower wiring 5011 by the molten metal bonding layer 5013.

At this time, the light emitting device 5100 is placed in a solution in a state where only the first electrode 5121 and the light emitting structure 5110 are formed. It is because when the second electrode 5122 is formed, a defect occurs in which the second electrode 5122 and the lower wiring 5011 are connected to each other.

Here, the alignment of two or more light emitting devices 5100 in one pixel region (P) is prevented by the shape of the positioning partition wall 5012 and the center region (S1). The center region (S1) of the light emitting structure 5110 is easily inserted into the positioning partition wall 5012 even when the center region (S1) is formed in a circular shape to rotate the light emitting structure 5110.

Figure 27D:
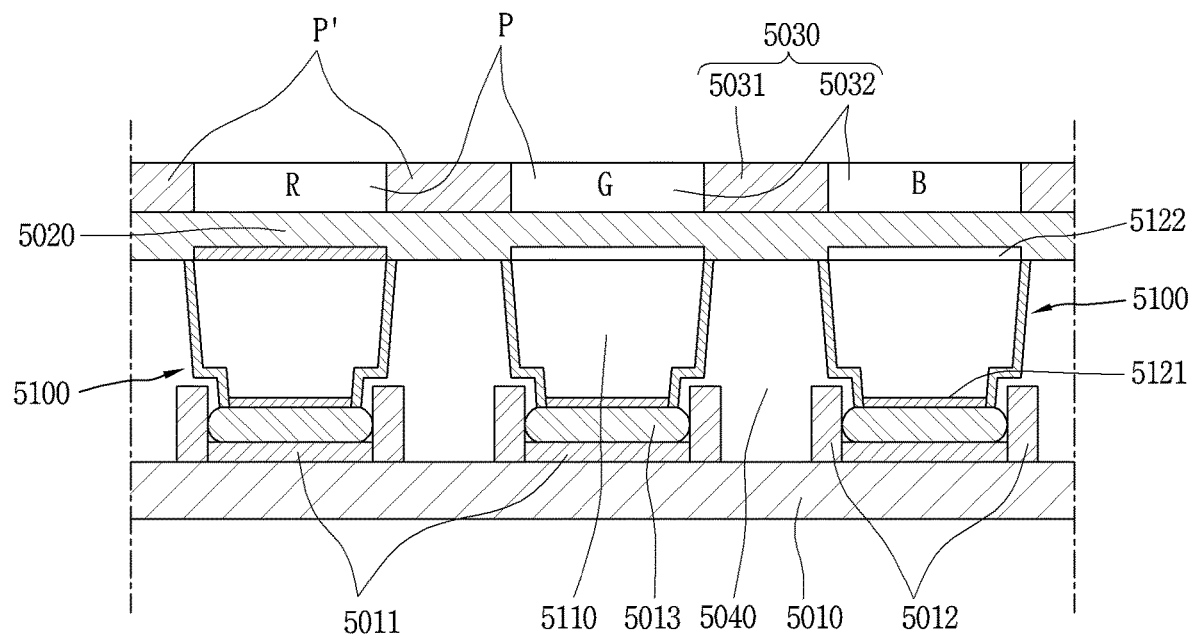

Referring to FIG. 27D, the second electrode 5122 is formed on the light emitting device 5100. A void between the light emitting devices 5100 is filled with a molding material and planarized. Then, the upper wiring 5020 and the color substrate 5030 are disposed on the light emitting device 5100.

Figure 28:
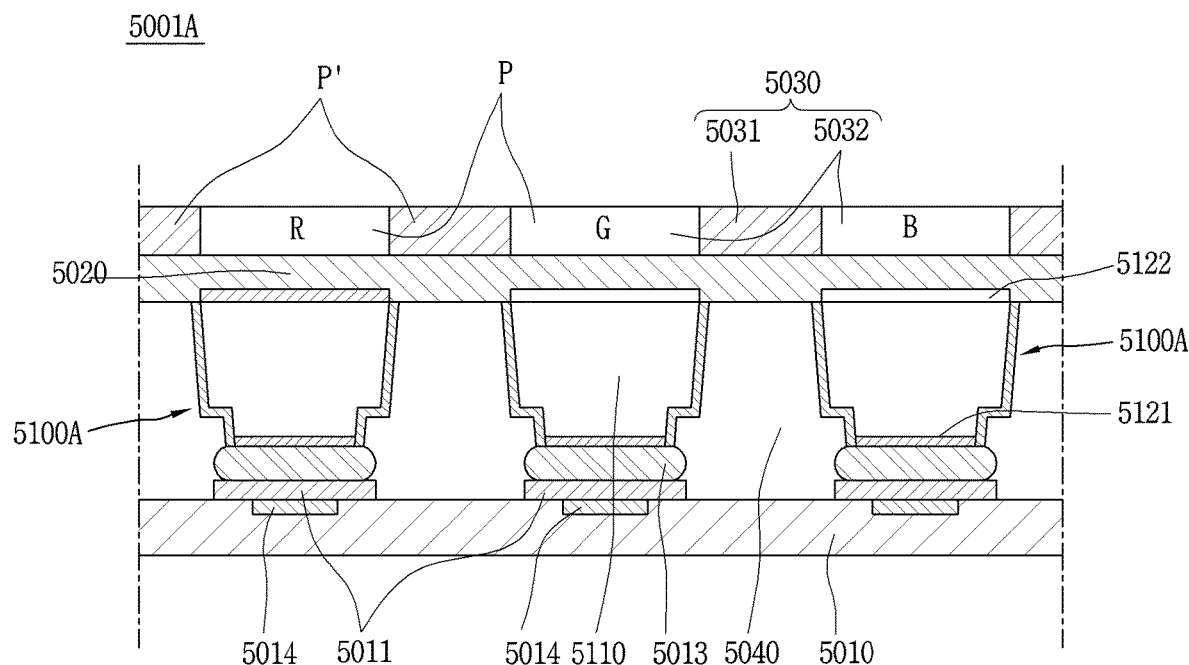
FIG. 28 is a cross-sectional view of a display device according to a second embodiment of the present disclosure.
Figure 29:
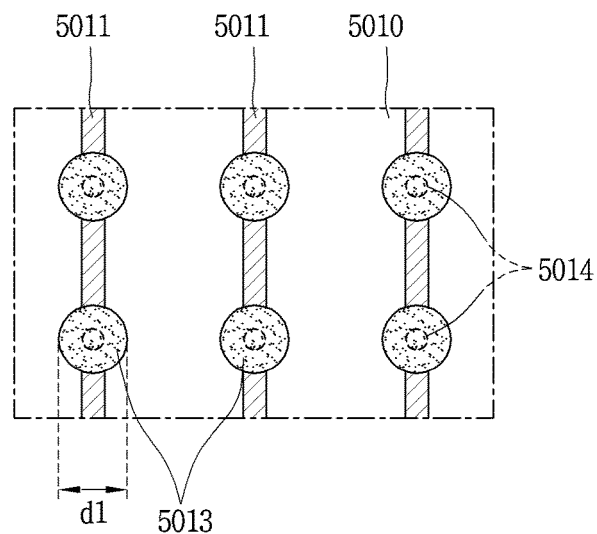
FIG. 29 is a plan view of a lower substrate according to the second embodiment of the present disclosure.
Figure 30:
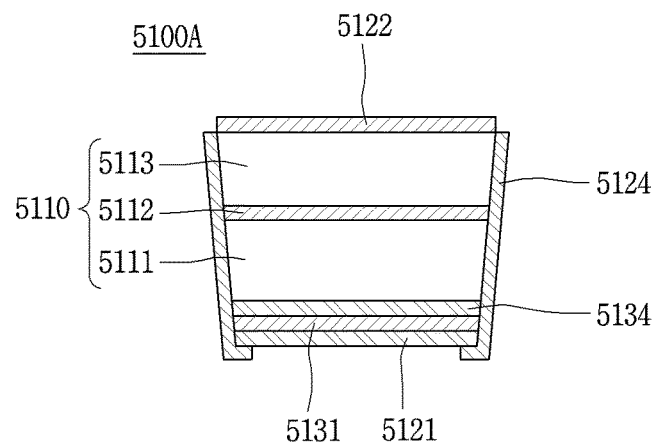
FIG. 30 is a cross-sectional view of a light emitting device according to the second embodiment of the present disclosure.

FIG. 28 is a cross-sectional view of a display device according to a second embodiment of the present disclosure, FIG. 29 is a plan view of a lower substrate according to the second embodiment of the present disclosure, and FIG. 30 is a cross-sectional view of a light emitting device according to the second embodiment of the present disclosure.

Referring to FIGS. 28 through 30, a display device 5001A of the second embodiment has a difference that further includes a structure of a light emitting device 5100A, and a magnetic portion located at either one of the lower substrate 5010 and the light emitting device 5100A and a reaction portion located at the other one thereof when compared to the first embodiment. Hereinafter, according to the second embodiment, differences from the first embodiment will be mainly described, and portions with no specific description are the same as those in the first embodiment.

The display device 5001A of the second embodiment includes a lower substrate 5010 on which at least two lower wirings 5011 are disposed, at least two light emitting devices 5100A having a first electrode 5121 electrically connected to the lower wirings 5011 and a light emitting structure 5110 for emitting light, and a magnetic portion located at either one of the lower substrate and the light emitting device 5100A and a reaction portion located at the other one of the lower substrate and the light emitting device 5100A and a lower substrate 5010 disposed at any one of the lower substrate 5010 and the light emitting device 5100A to apply an attractive force to the magnetic portion.

In the second embodiment, the positioning partition wall 5012 of the first embodiment is omitted. In the second embodiment, one light emitting device 5100A is self-aligned in one pixel region (P) by a magnetic force acting between the magnetic portion and the reaction portion.

On the lower wiring 5011, a metal bonding layer 5013 is disposed in a region where the light emitting device 5100A is to be positioned, similarly to the first embodiment.

The light emitting device 5100A of the second embodiment has no distinction between the center region (S1) and the peripheral region (S2) at a lower portion of the light emitting device 5100A as compared with the light emitting device 5100 of the first embodiment. In other words, the lower portion of the light emitting device 5100A is formed to be flat.

In particular, referring to FIG. 30, the light emitting device 5100A of the second embodiment includes a light emitting structure 5110 and a first electrode 5121 and a second electrode 5122. The display device 5001A of the second embodiment further includes an upper wiring 5020 electrically connected to the second electrode 5122 and a color substrate 5030 disposed on the light emitting device 5100A.

The light emitting structure 5110 includes a first conductive semiconductor layer 5111, an active layer 5112 positioned on the first conductive semiconductor layer 5111, and a second conductive semiconductor layer 5113 positioned on the active layer 5112.

The first electrode 5121 is exposed to a lower portion of the first conductive semiconductor layer 5111 and the second electrode 5122 is exposed to an upper portion of the second conductive semiconductor layer 5113.

In addition, the second embodiment further includes an insulating layer 5124. The insulating layer 5124 is disposed to surround at least a side surface of the light emitting structure 5110.

A plurality of light emitting devices 5100A are aligned on the lower wiring 5011 of the lower substrate 5010 by an attractive force between the magnetic portion and the reaction portion.

The magnetic portion is a material having a magnetic force. For example, the magnetic portion includes a magnet. The magnetic portion includes a permanent magnet or a temporary magnet. The magnetic portion is located at either one of the lower substrate 5010 and the light emitting device 5100A. However, when the magnetic portion is composed of magnet, it is preferable that the magnetic portion is located at the lower substrate 5010 since it is difficult to place the magnet on the light emitting device 5100A.

These magnetic portions define the alignment positions of the light emitting device 5100A on the lower substrate 5010. The magnetic portions are arranged on the lower substrate 5010 corresponding to the pixel region (P). Specifically, the magnetic portions are arranged to vertically overlap with a part of the lower wirings 5011 vertically overlapping with the pixel region (P).

The magnetic portions may be positioned below the lower wiring 5011. In other words, the magnetic portions may be positioned between the lower wiring 5011 and the lower substrate 5010. In addition, the magnetic portions may be located inside the lower substrate 5010 or on a lower surface of the lower substrate 5010. For example, as illustrated in FIG. 28, the magnetic portion may include a first magnetic portion 5014 embedded in the lower substrate 5010.

When an area of the magnetic portion is too large, a plurality of light emitting devices 5100A may be arranged in one pixel region (P). Therefore, a planar shape of the magnetic portions is formed to correspond to the first electrode 5121. Specifically, as illustrated in FIG. 29, the planar shape of the magnetic portions is circular. Furthermore, the area and width of the magnetic portions are formed to be smaller than those of the first electrode 5121.

At this time, the metal bonding layer 5013 is disposed to vertically overlap with the magnetic portion. The magnetic portion is disposed to vertically overlap with the center of the metal bonding layer 5013, and the magnetic portion is disposed at an edge of the metal bonding layer 5013 so as not to vertically overlap.

The reaction portion reacts with a magnetic force of the magnetic portion to generate an attractive force on the magnetic portion.

For example, the reaction portion includes a magnet that an attractive force is reacted on the magnetic portion. Specifically, the magnetic portion is a magnet having a first polarity, and the reacting portion is a magnet having a second polarity that is opposite to the first polarity.

For another example, the reaction portion includes a magnet that an attractive force is reacted on the magnetic portion. A magnetic metal is a metal, and includes a magnetic body that is attracted by an magnetic force of the magnet. The magnetic metal includes a ferromagnetic material. Specifically, the reaction portion includes any one element of Ni, Cr, Mo, and Fe, or an alloy of these elements.

The reaction F portion is located at the other one of the lower substrate 5010 and the light emitting device 5100A. Since the reaction portion is made of magnetic metal, and the reaction portion is preferably located in the light emitting device 5100A.

Since the reaction portion is a conductor, it is configured to be electrically connected to the first electrode 5121 and/or the second electrode 5122 during the growth process of the light emitting device 5100A to prevent an electrical short. Specifically, the reaction portion is preferably formed by a deposition or sputtering method together with the first electrode 5121 and/or the second electrode 5122.

In particular, referring to FIG. 30, the reaction portion of the reaction portion is implemented by a first magnetic electrode 5131 positioned between the first electrode 5121 and the first conductive semiconductor layer 5111. Therefore, the first magnetic electrode 5131 is positioned below the first conductive semiconductor layer 5111, and the first electrode 5121 is positioned below the first magnetic electrode 5131.

Of course, a bonding layer 5134 may be positioned between the first magnetic electrode 5131 and the first conductive semiconductor layer 5111 to improve a coupling force between the first magnetic electrode 5131 and the first conductive semiconductor layer 5111. The bonding layer 5134 is a compound of at least one element of Sn, Ag, Cu, Pb, Al, Bi, Cd, Fe, In, Ni, Sb, Zn, Co and Au or a compound of these elements. Furthermore, the bonding layer 5134 and the first magnetic electrode 5131 may be implemented as a single layer.

The first magnetic electrode 5131 is an electrically conductive material and includes a magnetic metal generating a magnetic force and an attractive force of the magnetic portion. The first magnetic electrode 5131 includes any one element of Ni, Cr, Mo, and Fe, or an alloy of these elements.

Figure 31:
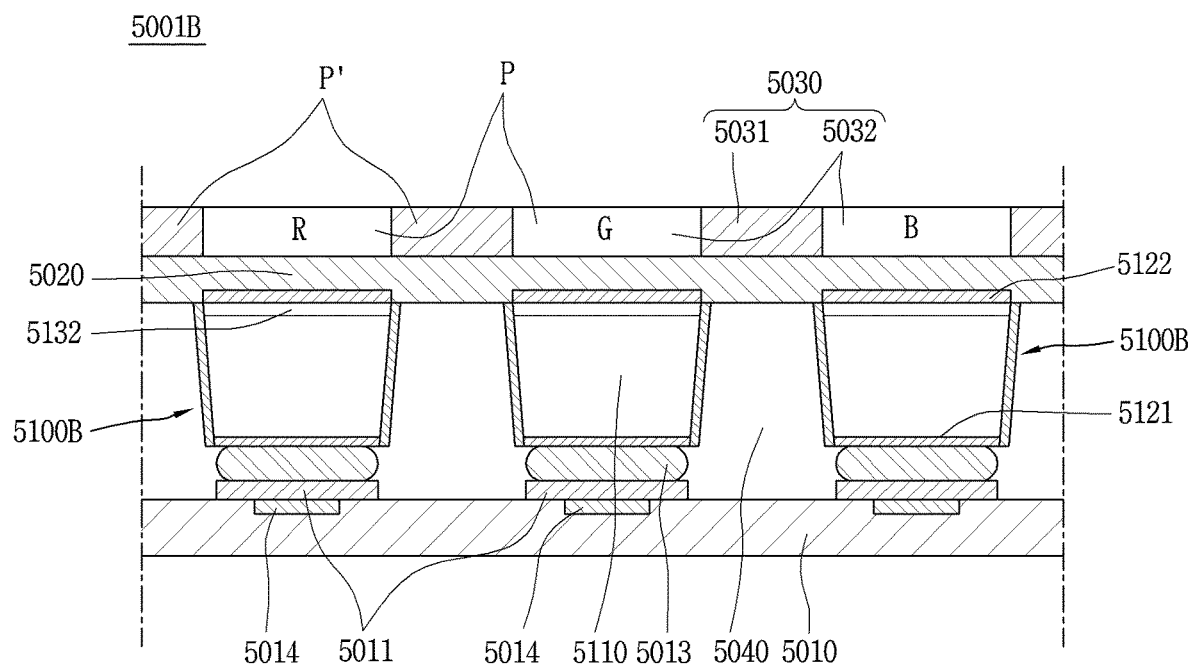
FIG. 31 is a cross-sectional view of a display device according to a third embodiment of the present disclosure.

FIG. 31 is a cross-sectional view of a display device according to a third embodiment of the present disclosure.

Referring to FIG. 31, a display device 5001B according to the third embodiment further includes a second magnetic portion 5015 and a second magnetic electrode 5132 as compared with the second embodiment.

The magnetic portion may include a first magnetic portion 5014 and a second magnetic portion 5015 or include only the second magnetic portion 5015 or only the first magnetic portion 5014. FIG. 13 illustrates the magnetic portion including the first magnetic portion 5014 and the second magnetic portion 5015.

When a magnetic force of the magnetic portion is weak, a probability of correct alignment of the light emitting device 5100B may be reduced, and thus a plurality of magnetic portions may be provided. In other words, a plurality of magnetic portions are provided in one pixel region (P).

The second magnetic portion 5015 is located on a lower surface of the lower substrate 5010. Specifically, the second magnetic portion 5015 is vertically overlapped with the first magnetic portion 5014 and has a shape and size corresponding to that of the first magnetic portion 5014.

The reaction portion may include the first magnetic electrode 5131 and the second magnetic electrode 5132, or include only the first magnetic electrode 5131. Referring to FIG. 31, the reaction portion is illustrated to include the first magnetic electrode 5131 and the second magnetic electrode 5132.

The second magnetic electrode 5132 is electrically connected to the second electrode 5122. The second magnetic electrode 5132 is positioned between the second electrode 5122 and the second conductive semiconductor layer 5113. The second magnetic electrode 5132 supplements a magnetic force when the magnetic force is insufficient due to the first magnetic electrode 5131 alone.

Figure 32A:
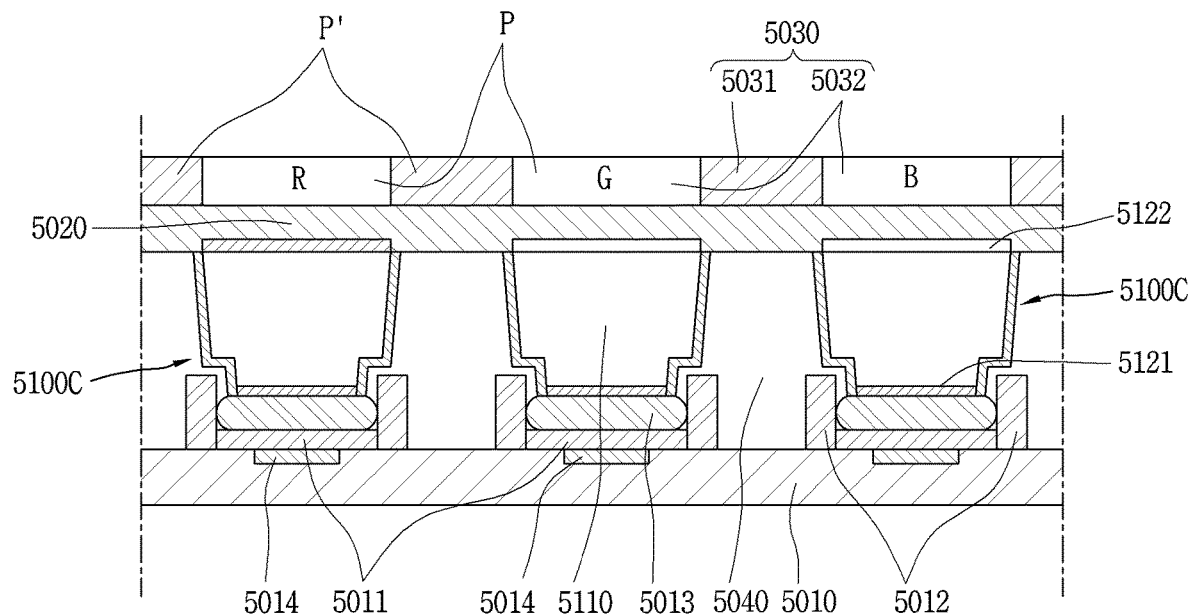
FIG. 32A is a cross-sectional view of a display device according to a fourth embodiment of the present disclosure.
Figure 32B:
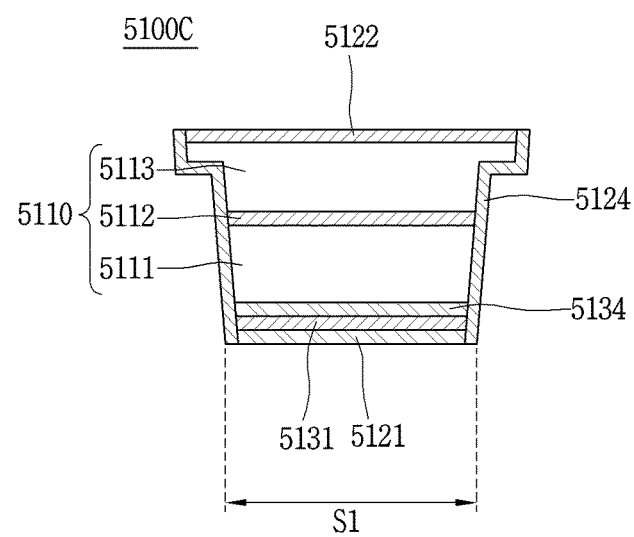
FIG. 32B is a cross-sectional view of a light emitting device according to a fourth embodiment of the present disclosure.

FIG. 32A is a cross-sectional view of a display device according to a fourth embodiment of the present disclosure, and FIG. 32B is a cross-sectional view of a light emitting device according to a fourth embodiment of the present disclosure.

The display device 5001C according to a fourth embodiment there exists a difference from the display device according to the second embodiment in the shape of the light emitting device 5100C.

The light emitting structure 5100C of the fourth embodiment has a structure in which the light emitting structure 5110 is partitioned into a center region (S1) and a peripheral region (S2) and the first electrode 5121 and the first magnetic electrode 5131 are positioned in the center region (S1). Of course, the center region (S1) and the peripheral region (S2) are the same as those described in the first embodiment.

Accordingly, a probability of locating a plurality of light emitting devices 5100C in a single pixel region (P) is reduced.

Figure 33A:
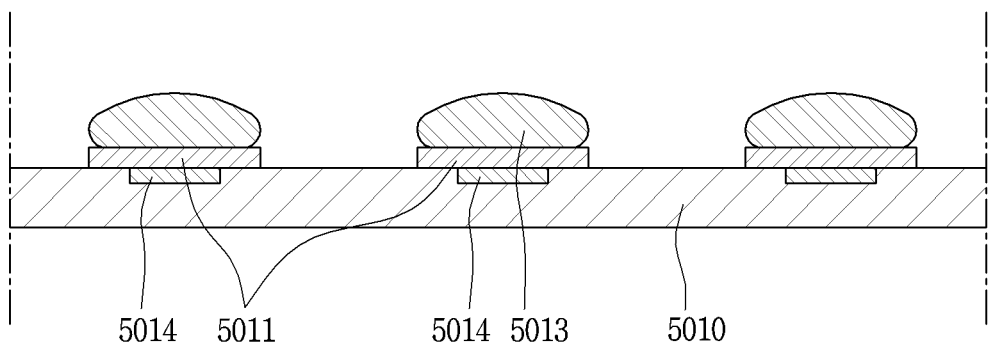
FIGS. 33A through 33C are flowcharts illustrating a method of fabricating a display device according to the second embodiment of the present disclosure.
Figure 33B:
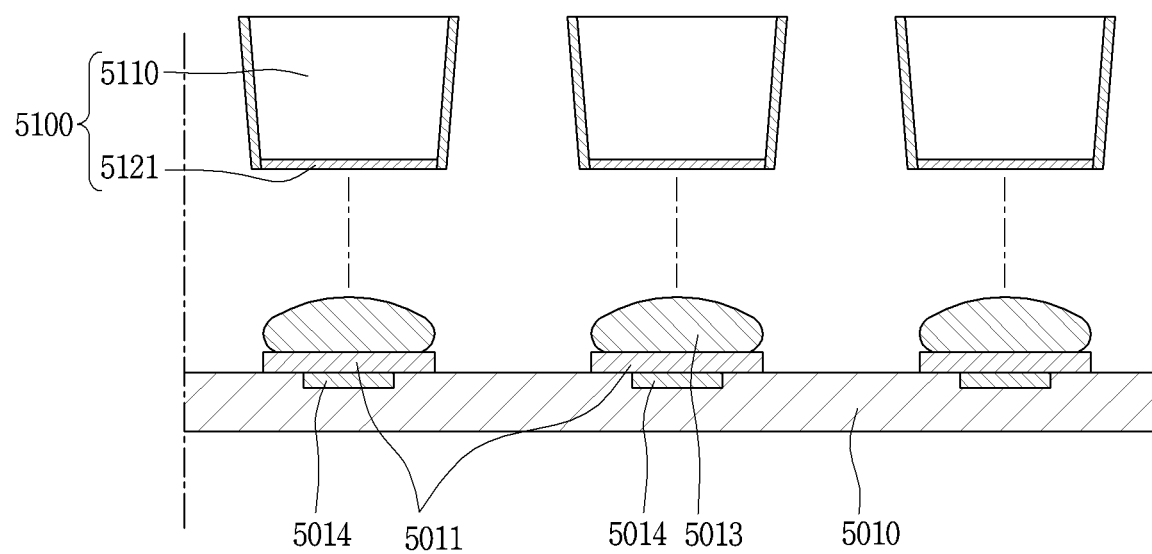
Figure 33C:
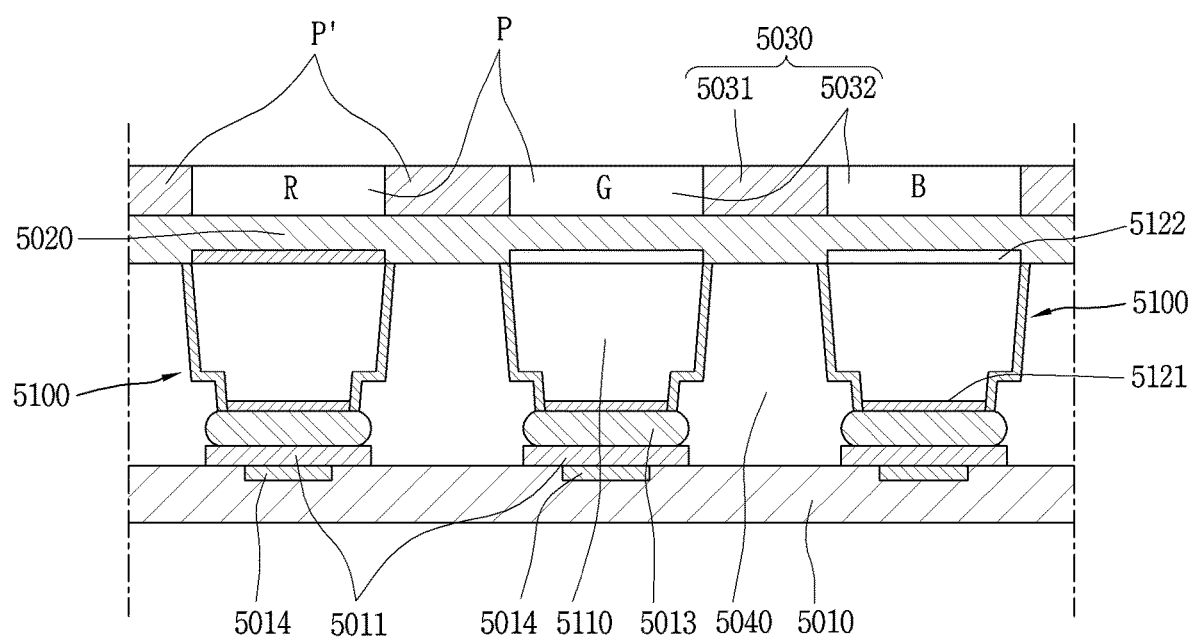

FIGS. 33A through 33C are flowcharts illustrating a method of fabricating a display device according to a second embodiment of the present disclosure.

Referring to FIG. 33A, first, a lower substrate 5010 having an upper wiring 5011 disposed thereon is prepared. A first magnetic portion 5014 is formed on the lower substrate 5010. The metal bonding layer 5013 is positioned on the lower wiring 5011 corresponding to the pixel region (P).

Referring to FIGS. 33B and 33C, a plurality of light emitting devices 5100A are aligned with respective pixel regions (P) by a capillary force acting between the metal bonding layer 5013 and the first electrode 5121 of the light emitting device 5100A and an attractive force acting between the first magnetic portion 5014 and the first magnetic electrode 5131 of the light emitting device 5100A. Specifically, the lower substrate 5010 is placed in a container containing a solution containing a plurality of light emitting devices 5100A, and vibration is applied thereto. The light emitting device 5100A is aligned with each pixel region (P) by a magnetic force and a capillary force in the solution. At this time, heat is applied to melt the metal bonding layer 5013. The first electrode 5121 is bonded onto the lower wiring 5011 by the molten metal bonding layer 5013.

At this time, the light emitting device 5100 is placed in a solution in a state where only the first electrode 5121, the first magnetic electrode 5131, and the light emitting structure 5110 are formed. It is because when the second electrode 5122 is formed, a defect occurs in which the second electrode 5122 and the lower wiring 5011 are connected to each other.

Then, the second electrode 5122 is formed on the light emitting device 5100A. A void between the light emitting devices 5100A is filled with a molding material and planarized. Then, the upper wiring 5020 and the color substrate 5030 are disposed on the light emitting device 5100A.

The configurations and methods according to the above-described embodiments will not be applicable in a limited way to the foregoing display device using a semiconductor light emitting device, and all or part of each embodiment may be selectively combined and configured to make various modifications thereto.

What is claimed is:
1. A display device, comprising:
a substrate having a plurality of metal pads; and
a plurality of semiconductor light emitting devices electrically connected to the metal pads,
wherein the substrate comprises:
a lower wiring made of a conductive material; and
an insulating layer covering the lower wiring,
wherein the metal pads are connected to the lower wiring and include corresponding protruding portions protruding through the insulating layer to be exposed outside of the insulating layer to face an end portion of a respective semiconductor light emitting device facing the substrate,
wherein the respective semiconductor light emitting device comprises:
an n-type semiconductor layer, an active layer and a p-type semiconductor layer;
a conductive electrode on the p-type semiconductor layer; and
a passivation layer configured to surround the respective semiconductor light emitting device and including a through hole through which the conductive electrode is exposed,
wherein the end portion of the respective semiconductor light emitting device facing the substrate is partitioned into a first portion in which the conductive electrode is exposed and a second portion in which the passivation layer is exposed,
wherein the passivation layer comprises a side surface portion covering a side surface of the respective semiconductor light emitting device and an extension portion extending from the side surface portion to cover the end portion,
wherein the conductive electrode comprises a protruding portion protruding through the through hole of the passivation layer and overlapping outer surfaces of the passivation layer,
wherein the protruding portion of the conductive electrode directly contacts a corresponding metal pad, and
wherein a width of the protruding portion of the conductive electrode is greater than a width of the corresponding metal pad.

2. The display device of claim 1, wherein a maximum width of the corresponding metal pad is a diameter or a diagonal distance of a portion of the corresponding metal pad exposed to the outside.

3. The display device of claim 2, wherein the portion of the corresponding metal pad exposed to the outside has a shape in which the end portion is reduced to 25 to 75%.

4. The display device of claim 3, wherein the first portion is formed in the same shape as the portion of the corresponding metal pad exposed to the outside.

5. The display device of claim 2, wherein the portion of the corresponding metal pad exposed to the outside is disposed at the center of the end portion.

6. The display device of claim 1, wherein the corresponding metal pad comprises an alloy made of at least two or more combinations of Bi, In, Pb, Sn and Ag.

7. The display device of claim 6, wherein the conductive electrode comprises a plurality of metal layers made of different metals.

8. The display device of claim 1, wherein the semiconductor light emitting device includes an n-type electrode and a p-type electrode.

9. The display device of claim 1, wherein an insulating material is filled between the semiconductor light emitting devices to form a planarizing layer, and an upper wiring electrically connected to the n-type electrode is disposed in the planarizing layer.

10. The display device of claim 1, wherein as a maximum width of the corresponding metal pad is set to a range of a width of the second portion to twice the width, a plurality of conductive electrodes are restricted from being brought into contact with the corresponding metal pad.

11. The display device of claim 1, wherein a width of the second portion is a maximum width of the passivation layer being overlapped with the active layer.

12. The display device of claim 1, wherein a width of the second portion is a maximum width of the passivation layer being overlapped with the n-type semiconductor layer.

13. The display device of claim 12, wherein a maximum width of the metal pad is set to a range of the width of the second portion to twice the width of the second portion.

\* \* \* \* \*